US008745563B2

(12) United States Patent
Jain et al.

(10) Patent No.: US 8,745,563 B2
(45) Date of Patent: Jun. 3, 2014

(54) COMPUTATIONALLY EFFICIENT MODELING AND SIMULATION OF LARGE SCALE SYSTEMS

(71) Applicant: Purdue Research Foundation, West Lafayette, IN (US)

(72) Inventors: Jitesh Jain, Rajasthan (IN); Stephen F Cauley, West Lafayette, IN (US); Hong Li, He nan (CN); Cheng-Kok Koh, West Lafayette, IN (US); Vankataramanan Balakrishnan, West Lafayette, IN (US)

(73) Assignee: Purdue Research Foundation, West Lafayette, IN (US)

( * ) Notice: Subject to any disclaimer, the term of this patent is extended or adjusted under 35 U.S.C. 154(b) by 0 days.

(21) Appl. No.: 13/710,145

(22) Filed: Dec. 10, 2012

(65) Prior Publication Data

US 2013/0124168 A1       May 16, 2013

Related U.S. Application Data

(63) Continuation of application No. 12/852,942, filed on Aug. 9, 2010, now Pat. No. 8,336,014.

(51) Int. Cl.
*G06F 17/50*     (2006.01)
(52) U.S. Cl.
USPC ............... 716/115; 716/106; 716/111; 703/4
(58) Field of Classification Search
USPC ............................... 716/106, 111, 115; 703/4
See application file for complete search history.

(56) References Cited

U.S. PATENT DOCUMENTS

| | | | | |
|---|---|---|---|---|
| 5,692,158 A | * | 11/1997 | Degeneff et al. | 703/2 |
| 6,041,170 A | * | 3/2000 | Feldmann et al. | 703/2 |
| 6,192,328 B1 | * | 2/2001 | Kahlert et al. | 703/2 |
| 6,820,245 B2 | * | 11/2004 | Beattie et al. | 716/115 |
| 7,228,259 B2 | * | 6/2007 | Freund | 703/2 |
| 7,307,492 B2 | * | 12/2007 | Tripathi et al. | 333/111 |
| 7,353,157 B2 | * | 4/2008 | Wasynczuk et al. | 703/14 |
| 2003/0177458 A1 | * | 9/2003 | Beattie et al. | 716/4 |

OTHER PUBLICATIONS

Jain et al.; "Fast simulation of VLSI interconnects"; IEEE/ACM International Conference; publication date: Nov. 7-11, 2004; pp. 93-98.*

* cited by examiner

*Primary Examiner* — Naum Levin
(74) *Attorney, Agent, or Firm* — Purdue Research Foundation

(57) ABSTRACT

A system for simulating operation of a VLSI interconnect structure having capacitive and inductive coupling between nodes thereof, including a processor, and a memory, the processor configured to perform obtaining a matrix X and a matrix Y containing different combinations of passive circuit element values for the interconnect structure, the element values for each matrix including inductance L and inverse capacitance P, obtaining an adjacency matrix A associated with the interconnect structure, storing the matrices X, Y, and A in the memory, and performing numerical integration to solve first and second equations.

3 Claims, 17 Drawing Sheets

COMPUTATIONALLY EFFICIENT MODELING AND SIMULATION OF LARGE SCALE SYSTEMS

CROSS-REFERENCE TO RELATED APPLICATIONS

This application is a continuation application of patent application Ser. No. 12/852,942, filed on Aug. 9, 2010, now U.S. Pat. No. 8,336,014 to Jain et al., issued Dec. 18, 2012, which is a divisional application of patent application Ser. No. 11/593,465, filed on Nov. 6, 2006, now U.S. Pat. No. 7,774,725 to Jain et al., issued Aug. 10, 2010, which claims the benefit of Provisional Patent Application No. 60/733,460, filed Nov. 4, 2005, and Provisional Patent Application No. 60/740,990, filed Nov. 30, 2005, which applications are hereby incorporated by reference along with all references cited therein.

GOVERNMENT RIGHTS

This invention was made with government support under Contract/Grant No. NCC 2-1363 awarded by the National Aeronautics and Space Administration (NASA), under Contract/Grant Nos. CCR-9984553 and CCR-0203362 awarded by the National Science Foundation, and under Contract/Grant No. USAF-FA8650-04-D-2409 awarded by the United States Air Force Research Laboratories. The government has certain rights in the invention.

TECHNICAL FIELD OF THE INVENTION

The present invention relates generally to electrical circuit modeling and simulation techniques and, more particularly, to methods for simulating interconnect effects in very large scale integrated circuits.

BACKGROUND OF THE INVENTION

With aggressive technology scaling, the accurate and efficient modeling and simulation of interconnect effects has become (and continues to be) a problem of central importance. In a three-dimensional interconnect structure there can be significant amounts of coupling, both inductive and capacitive, between interconnects. Models that capture these effects tend to involve large matrices, resulting in extraordinary demands on memory. Simulation with these models require prohibitive amounts of computation.

While all coupling effects in theory extend without bound, it is well-recognized that, in practice, the effects of capacitive coupling, and to some extent that of inductive coupling, can be assumed to be local without much sacrifice in accuracy. Practical modeling and simulation techniques exploit this localization to significantly reduce storage and computational costs. For practical interconnect structures, the capacitance matrix C and the inverse of the inductance matrix $K=L^{-1}$ turn out to be (approximately) sparse. A number of techniques exploit the sparsity in K at extraction level. Exploiting sparsity of C and K in simulation however, is much less straightforward. The main problem is that simulation requires terms that not only involve the sparsified matrices C and K, but also inverses of terms that involve them; these inverses are dense in general.

The Modified Nodal Analysis (MNA) of interconnect structures such as the one shown in FIG. 1 yields equations of the form $$\tilde{G}x + \tilde{C}\dot{x} = b, \quad (1)$$

where $$\tilde{G} = \begin{bmatrix} \mathcal{G} & A_l^T \\ -A_l & 0 \end{bmatrix}, \tilde{C} = \begin{bmatrix} C & 0 \\ 0 & L \end{bmatrix}, x = \begin{bmatrix} v_n \\ i_l \end{bmatrix},$$

$$b = \begin{bmatrix} A_i T_{I_s} \\ 0 \end{bmatrix}, \mathcal{G} = A_g^T R^{-1} A_g, \text{ and } C = A_c^T C A_c.$$

R is the resistance matrix. The matrices $\mathcal{G}$, L and C are the conductance, inductance and capacitance matrices respectively, with corresponding adjacency matrices $A_g$, $A_l$ and $A_c$. $I_s$ is the current source vector with adjacency matrix $A_i$, and $v_n$ and $i_l$ are the node voltages and inductor currents respectively. With n denoting the number of inductors, we note that $$L, C, R \in R^{n \times n}, C, \mathcal{G} \in R^{2n \times 2n}.$$

A standard algorithm for the numerical integration of differential equations such as (1) is the trapezoidal method. Consider a uniform discretization of the time axis with resolution h. Then, using the notation $x^k=x(kh)$, and the approximations $$\frac{d}{dt}x(t)\bigg|_{t=kh} \approx \frac{x^{k+1}-x^k}{h} \text{ and } x^k \approx \frac{x^{k+1}-x^k}{2}$$

over the interval [kh,(k+1)h], we may solve for $x^{k+1}$ in terms of $x^k$ by solving the equation $$\left(\frac{\tilde{G}}{2}+\frac{\tilde{C}}{h}\right)x^{k+1} = -\left(\frac{\tilde{G}}{2}-\frac{\tilde{C}}{h}\right)x^k + \frac{b^{k+1}+b^k}{2}. \quad (2)$$

A direct implementation of this algorithm requires $O(n^3+pn^2)$ operations, where p is the number of time steps. The direct implementation ignores the structure of the matrices $\tilde{G}$ and $\tilde{C}$ that is evident in (1); explicitly recognizing this structure yields the so-called Nodal Analysis (NA) equations, used in INDUCTWISE:

$$\underbrace{\left(\mathcal{G}+\frac{2}{h}C+\frac{h}{2}S\right)}_{U}v_n^{k+1} = \underbrace{\left(-\mathcal{G}+\frac{2}{h}C-\frac{h}{2}S\right)}_{V}v_n^k - 2A_l^T i_l^k + A_i^T(I_s^{k+1}+I_s^k). \quad (3)$$

and $$2A_l^T i_l^{k+1} = 2A_l^T i_l^k + hS(v_n^{k+1}+v_n^k), \quad (4)$$

where $S=A_l K A_l^T$ (recall that $K=L^{-1}$, L being the inductance matrix, with corresponding adjacency matrix $A_l$, and $A_l^T$ being the transpose of $A_l$).

The NA equations (3) and (4) enjoy several advantages over the MNA equations (1). The first advantage is that the solution of equations (1), a problem of size 3n, has been divided into two sub-problems of sizes 2n and 2n, which yields computational savings with polynomial-time algorithms. Next, it has been observed that with typical VLSI interconnect structures, the matrices K, C and $\mathcal{G}$ exhibit sparsity. This can be used at the extraction stage to write down (3) and (4) with fewer parameters. Finally, at the simulation stage, the structure of the matrix U defined in (3)—symmetry, positive-definiteness and sparsity—lends itself to the use of fast and sound numerical techniques such as Cholesky factorizations. These advantages have been extensively used to develop INDUCTWISE. For future reference, we note that the computation with INDUCTWISE is $O(n^3+pn^2)$ operations, and is usually dominated by $O(pn^2)$.

SUMMARY OF THE INVENTION

The approach that is employed is to sparsify the various matrices that underlie the model of interconnects; the resulting approximate models can be represented by far fewer parameters, leading to savings in storage.

The present invention presents methods that systematically take advantage of sparsity in C and K, in simulation, achieving a very significant reduction in computation with very little sacrifice in simulation accuracy. The first idea underlying our approach is that if the sparsity in the inverse of a dense matrix is known, the (sparse) inverse can be computed very efficiently. We take advantage of this fact by writing the simulation equations in terms of L and $P=C^{-1}$. The most computationally intensive step in simulation, of system formulated in such a fashion, reduces to that of matrix-vector multiplication involving a sparse matrix. We also show that savings with sparse-matrix-vector multiplication can be obtained with simulation using $K=L^{-1}$ and C, as well, but to a lesser extent.

The RLP formulation is extended to include non-linear devices, without sacrificing the computational benefits achieved due to sparsity of the linear system. It should be noted that the A matrix involved in the solution of the linear system is constant throughout the simulation. In contrast, the A matrix involved in solving the non-linear system changes in each simulation step. However, the A matrix is sparse. Due to the sparse and time varying nature of the problem at hand Krylov subspace based iterative methods could be used for efficient simulation. Our second contribution is to introduce a novel preconditioner constructed based on the sparsity structure of the non-linear system. The inverse of the preconditioner has a compact representation in the form of the Hadamard product, which facilitates not only the fast computation of the inverse, but also the fast dense matrix-vector product.

The objects and advantages of the present invention will be more apparent upon reading the following detailed description in conjunction with the accompanying drawings.

BRIEF DESCRIPTION OF THE DRAWINGS

FIGS. 4($b$) and 4($c$) show the significant entries (shown darker) of $W^{-1}$ and $X^{-1}$, respectively, for the structure in FIG. 4($a$).

DETAILED DESCRIPTION OF THE PREFERRED EMBODIMENTS

Figure 1:
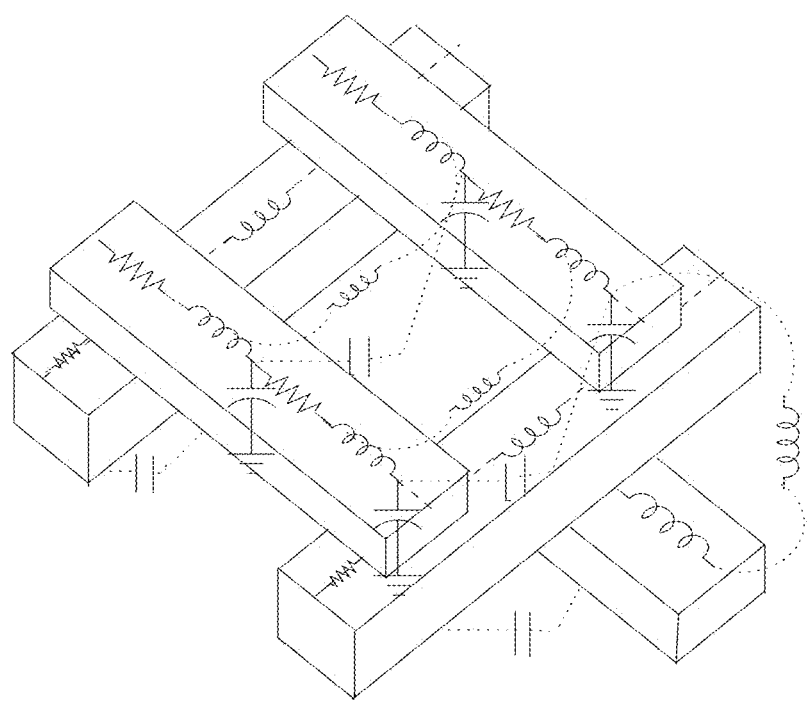
FIG. 1 a distributed model of a typical three dimensional VLSI interconnect structure that may be operated in simulation with the methods of the present invention.

For the purpose of promoting an understanding of the principles of the invention, reference will now be made to the embodiments illustrated in the drawings and specific language will be used to describe the same. It will nevertheless be understood that no limitation of the scope of the invention is thereby intended, such alterations and further modifications in the illustrated device and such further applications of the principles of the invention as illustrated therein being contemplated as would normally occur to one skilled in the art to which the invention relates.

While significant storage and computational advantages accrue with INDUCTWISE, we note that the sparsity of U has not been fully taken advantage of at the level of linear algebra (beyond the possible use of sparse Cholesky factorizations) in the numerical solution of (3). In particular, with the formulation used by INDUCTWISE, while the matrix U is sparse, its inverse is dense. Thus, trapezoidal numerical integration, at a first glance, entails matrix-vector multiplies with a dense matrix at each time step. However, it has been observed that the matrices $U^{-1}V$ (where V is defined in (3)), $U^{-1}A_l^T$, $U^{-1}A_s^T$ and $U^{-1}S$ are approximately sparse, and this information can be used to significantly reduce the computation as follows. Rewrite (3) and (4) as $$v_n^{k+1} = U^{-1}Vv_n^k - 2U^{-1}A_l^T i_l^k + U^{-1}A_s^T(I_s^{k+1} + I_s^k)$$

$$2U^{-1}A_l^T i_l^{k+1} = 2U^{-1}A_l^T i_l^k + hU^{-1}S(v_n^{k+1} + v_n^k).$$

Pre-compute and store the sparsified matrices $U^{-1}V$, $U^{-1}A_l^T$, $U^{-1}A_s^T$ and $U^{-1}S$. Then, every time step in the trapezoidal integration scheme requires only sparse matrix-vector multiplies. We will henceforth refer to this technique as the GKC-algorithm (as the computations are done with the conductance, inverse of the inductance and the capacitance as the parameters).

Figure 2:
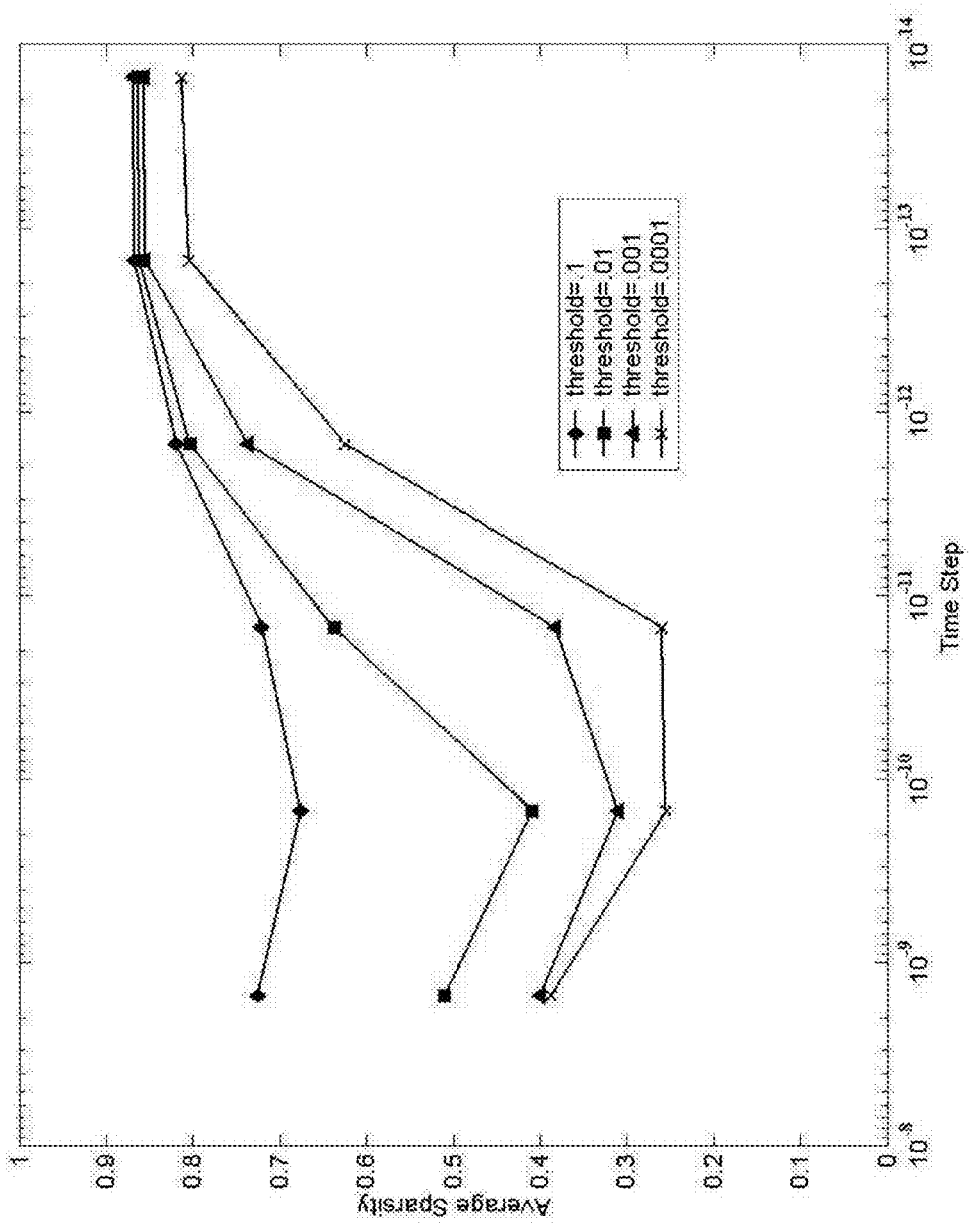
FIG. 2 shows the average sparsity index of the matrices $U^{-1}V$, $U^{-1}A_l^T$, $U^{-1}A_s^T$ and $U^{-1}S$, for a structure as a function of h for various values of $\epsilon$.

In order to quantify the computational savings obtained with the GKC-algorithm over INDUCTWISE, we define the "sparsity index" $\mu_\epsilon(A)$ of a matrix A as ratio of the number of entries of A with absolute value less than $\epsilon$ to the total number of entries. Then, the computation required for each iteration with the GKC-algorithm, with some appropriate value of $\epsilon$, is $O((1-v)n^2)$ where $v$ is the minimum of the sparsity indices of the matrices $U^{-1}V$, $U^{-1}A_l^T$, $U^{-1}A_l^T$ and $U^{-1}S$. The value of $v$ can be expected to depend on the threshold for detecting sparsity $\epsilon$, as well as the time step size h. FIG. 2 shows the average sparsity index of the matrices $U^{-1}V$, $U^{-1}A_l^T$, $U^{-1}A_l^T$ and $U^{-1}S$, for a structure with three parallel planes consisting of 600 conductors, as a function of h for various values of $\epsilon$. The typical value of h used solving the MNA equations for VLSI interconnects is 0.1 picoseconds. With such values of h and $\epsilon=0.001$, it can be seen that $v\approx0.8$. Thus the total computation time with the GKC-algorithm is approximately a fifth of that required by INDUCTWISE.

We now explore an alternative formulation of the MNA equations that uses the resistance, inductance and the inverse of the capacitance matrix. For typical interconnect structures, shown in FIG. 1, we can manipulate the MNA equations (2) to obtain $$\underbrace{\left(\frac{L}{h} + \frac{R}{2} + \frac{h}{4}APA^T\right)}_{X} i_l^{k+1} = \underbrace{\left(\frac{L}{h} - \frac{R}{2} - \frac{h}{4}APA^T\right)}_{Y} i_l^k + Av_n^k + \frac{h}{4}AP(I_s^{k+1} + I_s^k), \quad (5)$$

and $$v_n^{k+1} = v_n^k - \frac{h}{2}PA^T(i_l^{k+1} + i_l^k) + \frac{h}{2}P(I_s^{k+1} + I_s^k), \quad (6)$$

where P is the inverse capacitance matrix i.e $P=C^{-1}$ and A is the adjacency matrix of the circuit, obtained by first adding $A_g$ and $A_l$ and then removing zero columns (these correspond to intermediate nodes, representing the connection of a resistance to an inductance). When compared with the NA equations (3) and (4), we see that the number of state variables has been halved. Compared to INDUCTWISE, this represents immediate savings. For future reference, we will term the technique of directly solving (5) and (6) as the "Exact-RLP" algorithm.

In contrast with the GKC-algorithm, it turns out here that X is dense, but with an inverse that is approximately sparse. Thus, windowing techniques such as those employed by INDUCTWISE during the extraction stage to obtain a sparsified matrix K can be employed here to quickly compute a sparsified $X^{-1}$. (Windowing techniques details will be described below.) Moreover, the matrices $X^{-1}Y$, $X^{-1}A$ and $X^{-1}AP$ turn out to be approximately sparse. Thus, paralleling the development of the GKC-algorithm, we have the following RLP-algorithm:

Rewrite (5) and (6) as $$i_l^{k+1} = X^{-1}Yi_l^k + X^{-1}Av_n^k + \frac{h}{4}X^{-1}AP(I_s^{k+1} + I_s^k),$$

$$X^{-1}Av_n^{k+1} = X^{-1}Av_n^k - \frac{h}{2}X^{-1}APA^T(i_l^{k+1} + i_l^k) + \frac{h}{2}X^{-1}AP(I_s^{k+1} + I_s^k).$$

Pre-compute and store the sparsified matrices $X^{-1}Y$, $X^{-1}A$ and $X^{-1}AP$. Again, every time-step in the trapezoidal integration scheme requires only sparse matrix-vector multiplies. As with the GKC-algorithm, the total computation with the RLP-algorithm is dominated by $O((1-\gamma)n^2)$, where is the $\gamma$ is the minimum of the sparsity indices the matrices $X^{-1}Y$, $X^{-1}A$ and $X^{-1}AP$.

Figure 3:
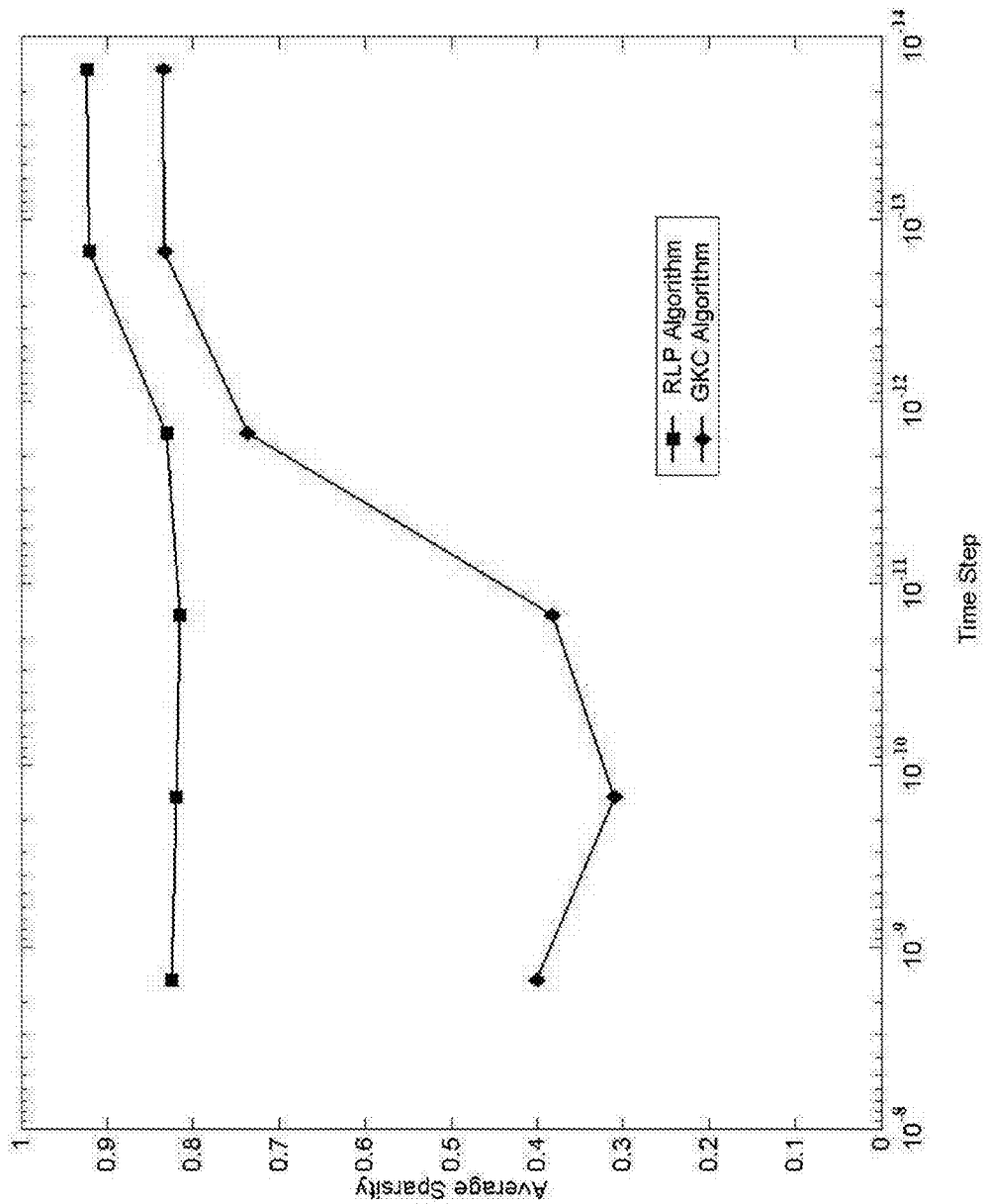
FIG. 3 shows average sparsity index of the matrices $X^{-1}Y$, $X^{-1}A$ and $X^{-1}AP$, for a structure as a function of h for the sparsity threshold of $\epsilon=0.001$, as compared with the average sparsity index of the matrices encountered in the GKC-algorithm.

FIG. 3 shows the average sparsity index of the matrices $X^{-1}Y$, $X^{-1}A$ and $X^{-1}AP$, for a structure with three parallel planes consisting of 600 conductors, as a function of h for the sparsity threshold of $\epsilon=0.001$, as compared with the average sparsity index of the matrices encountered in the GKC-algorithm. It is clear that the matrices encountered in the RLP-algorithm exhibit much higher sparsity over a wide range of time-steps. In particular, for h=0.1 ps, it can be seen that $\gamma\approx0.9$. Thus the total computation time with the above RLP-algorithm is approximately one-tenth of that required by the RLP formulation that does not use sparsity information. When compared to the GKC-algorithm and INDUCTWISE which use twice as many state variables, the amount of computation required by the RLP-algorithm is approximately one-eighth and one-fiftieth respectively.

We now provide the details on the fast inversion of X. Assume for simplicity that the sparsity pattern in $X^{-1}$ is known, deferring for later the problem of detecting this sparsity pattern. Then, manipulations of only a subset of the entries of the X matrix (rather than the entire X matrix) can be used to compute the inverse matrix. To briefly illustrate the idea consider the example when $X \in R^{11 \times 11}$, and the 5th row of $X^{-1}$ has the following form:

[0 0 ★ 0 ★ 0 0 ★ 0 0], where ★ denotes the nonzero entries. Then, it can be shown that these nonzero entries can be computed exactly from the second row of the inverse of the following 3×3 matrix obtained from X:

$$\begin{bmatrix} X_{33} & X_{35} & X_{38} \\ X_{53} & X_{55} & X_{58} \\ X_{83} & X_{85} & X_{88} \end{bmatrix}.$$

More generally, suppose that there are $\alpha_i$ nonzero entries in the ith row of $X^{-1}$. By following a procedure as above, the ith row of $X^{-1}$ can be computed by inverting an $\alpha_i \times \alpha_i$ matrix. Thus, the overall computation in determining is $X^{-1}$ is $O(\Sigma_i \alpha_i^3)$. It is typical with VLSI interconnects that $\alpha_i$ is a small constant. Thus if $X^{-1}$ is exactly sparse, with a known sparsity pattern, it can be computed in $O(n)$ from X. Table 1 gives the time taken for inversion for different circuit sizes.

TABLE 1

Inversion time in matlab (in seconds)

| | No. of conductors | | | |
|---|---|---|---|---|
| | 500 | 1000 | 2000 | 5000 |
| Direct Inversion | .29 | 2.18 | 16.87 | 260.68 |
| Fast Inversion | .79 | 1.48 | 2.93 | 10.17 |

Thus, there remains the problem of determining the sparsity pattern in $X^{-1}$. Recall that $$X = \frac{L}{h} + \frac{R}{2} + \frac{h}{4}APA^T.$$

Let $$W = \frac{L}{h} + \frac{R}{2} \text{ and } Z = \frac{h}{4}APA^T.$$

Then $$X^{-1} = W^{-1} - W^{-1}(W^{-1}+Z^{-1})^{-1}W^{-1}. \quad (7)$$

For the values of R, L, C and h under consideration, it turns out that $$X^{-1} \approx W^{-1} - W^{-1}ZW^{-1}. \quad (8)$$

Thus, the significant entries of $X^{-1}$ can be obtained by superposing the significant entries of $W^{-1}$ and the significant entries of $W^{-1}ZW^{-1}$. The sparsity pattern of $W^{-1}$ can be efficiently determined using the techniques available in the literature. Turning next to $$W^{-1}ZW^{-1} = \frac{h}{4}W^{-1}APA^TW^{-1},$$

note that the significant entries of $W^{-1}A$ are obtained by distributing the significant entries of $W^{-1}$ into locations determined by the adjacency matrix A. In summary, we have the following heuristic for predicting the sparsity pattern in $X^{-1}$: First determine the significant entries of $W^{-1}$ by determining the set of segments that are inductively couple with a given segment. In addition, spread the nonzero entries of $W^{-1}$ to locations suggested by the adjacency matrix to find the remaining significant entries.

Figure 4A:
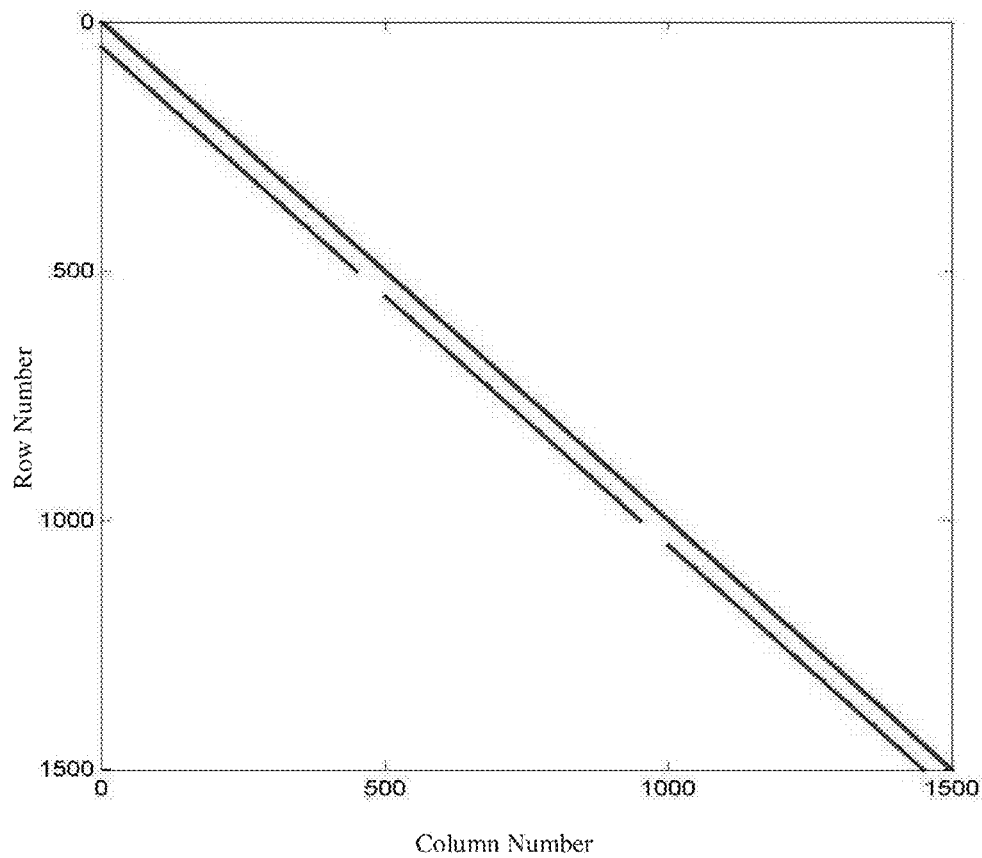
FIG. 4($a$) shows the significant entries (shown darker) of the adjacency matrix A for a structure with 1500 conductors.
Figure 4B:
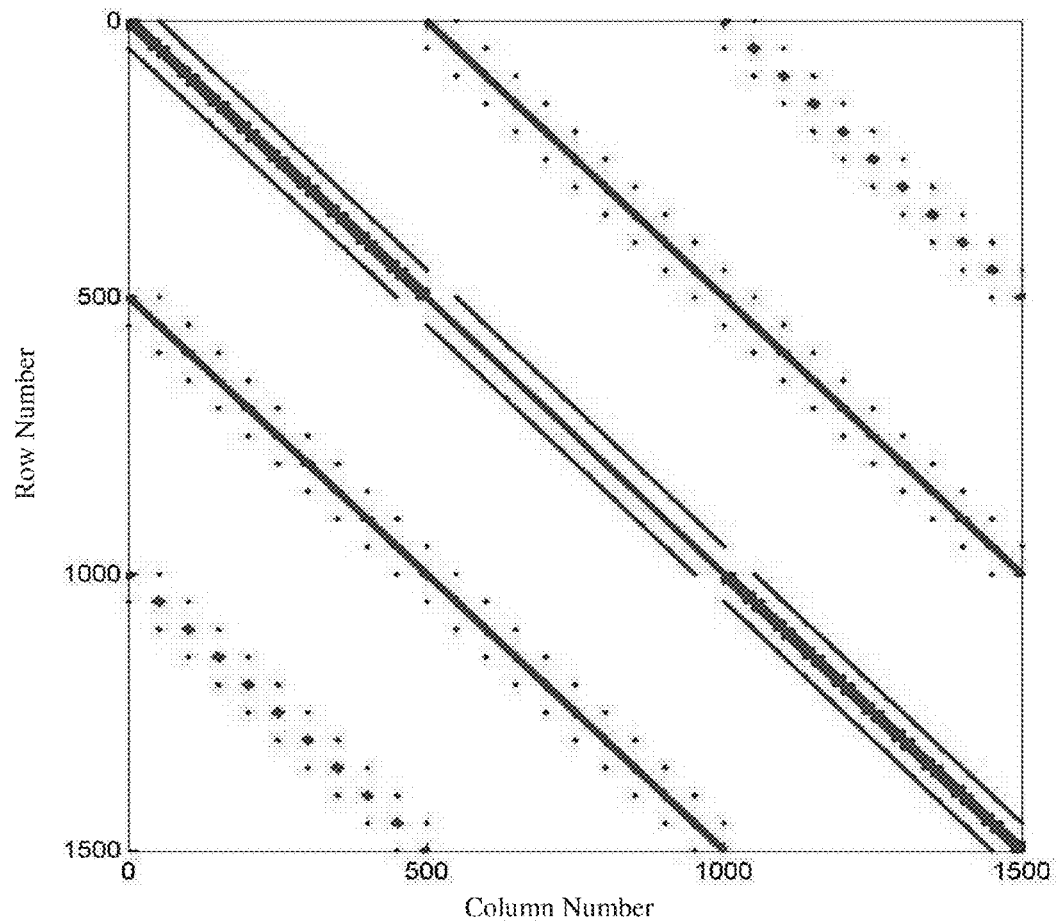
Figure 4C:
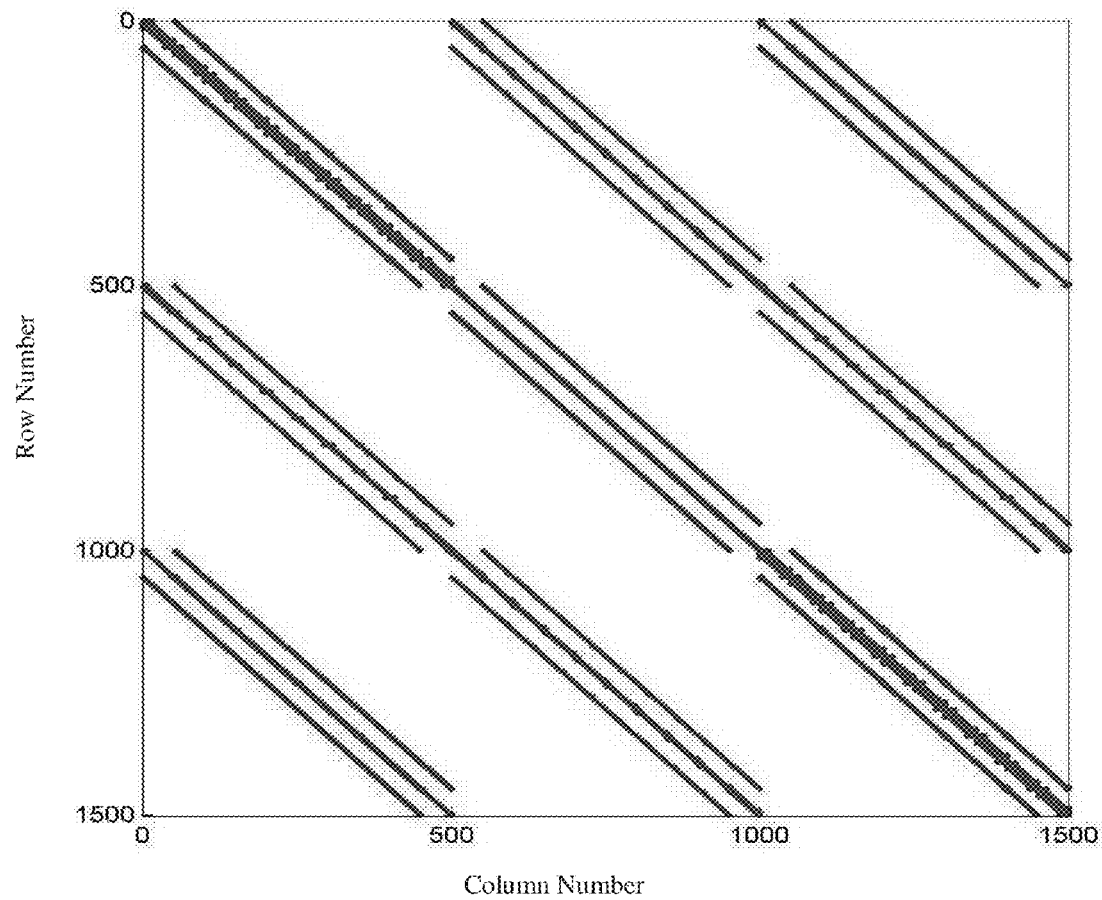

These ideas are illustrated via a three dimensional interconnect structure of three parallel planes with 1500 conductors. In FIG. 4(a), the significant entries of the adjacency matrix A are shown to be darker. FIGS. 4(b) and 4(c) show the entries of $W^{-1}$ and $X^{-1}$ respectively, again with the significant entries shown darker.

We emphasize that the actual computation of the significant entries of $X^{-1}$ proceeds via the technique in, where given the knowledge of the sparsity pattern resident in $X^{-1}$, the actual entries can be directly and efficiently computed. Thus, (7) and (8) are not used for computation, but only to motivate the heuristic for efficiently determining the sparsity pattern of $X^{-1}$.

Figure 5:
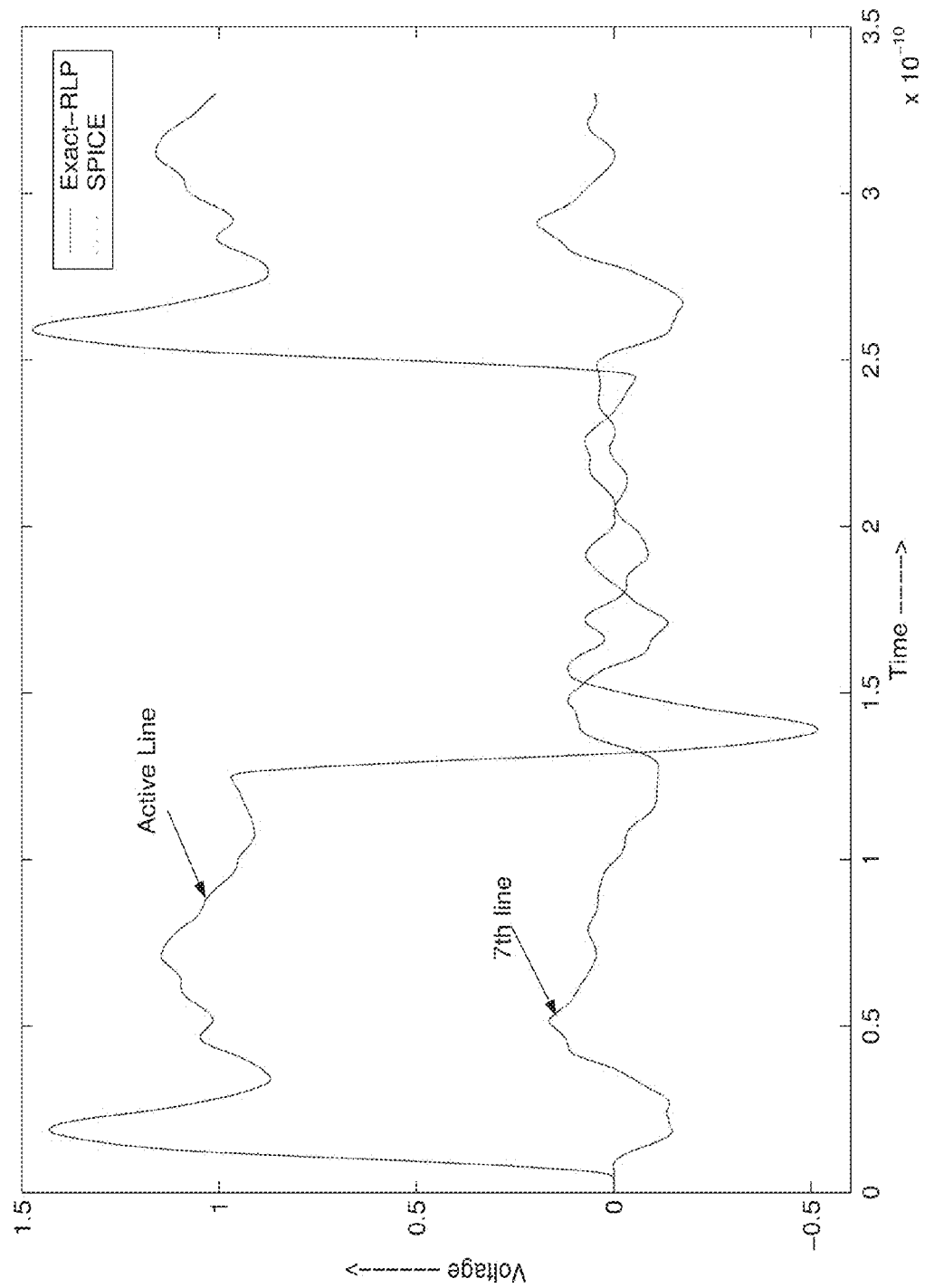
FIG. 5 shows the voltage wave forms, obtained from SPICE and Exact-RLP, of the active line and the seventh line of a 100-conductor circuit.

We implemented the INDUCTWISE, RLP and GKC algorithms in MATLAB on a PC with an Intel Pentium IV 2.4 GHz processor. In order to quantify the simulation accuracy with various methods, we used as the benchmark the Exact-RLP simulation (recall that this is the direct simulation of equations (5) and (6)). (While SPICE simulations would have been more natural to use as the benchmark, we found that the computation time grew quickly to make them impractical; for a modest-size circuit comprising 100 parallel conductors, SPICE simulation took 350 seconds as compared to 1.08 seconds with the Exact-RLP algorithm, with no detectable simulation error, as shown in the FIG. 5).

Simulations were done on a three dimensional structure of three parallel planes, with each plane consisting of busses with parallel conductors, with wire-lengths of 1 mm, and a cross section of 1 μm×1 μm. The wire separation was taken to be 1 μm; each wire was divided into ten segments. A periodic 1V square wave with rise and fall times of 6 ps each was applied to the first signal on the lowest plane, with a time period of 240 ps. All the other lines were assumed to be quiet. For each wire, the drive resistance was 10Ω the load capacitance was 20 fF. A time step of 0.15 ps was taken and the simulation was performed over 330 ps (or 2200 time steps).

As expected, with all methods, there is an inherent trade-off between simulation accuracy and cost (CPU time and memory). We first present results comparing the accuracy in simulating the voltage waveforms at the far end of the first (active) and the seventh (victim or quiet) lines. The metric for comparing the simulations is the relative mean square error (RMSE) defined as $$\frac{\sum_i (v_i - \tilde{v}_i)^2}{\sum_i v_i^2}$$

where v and $\tilde{v}$ denote the waveforms obtained from Exact-RLP and the algorithm under consideration respectively. A threshold value of 0.001 was chosen for sparsification of RLP and GKC algorithms, as well as for sparsification of $L^{-1}$ in INDUCTWISE. Table 2 presents a summary of the results from the study of simulation accuracy.

TABLE 2

RMSE comparison.

| | Active Line | | | 7th line | | |
|---|---|---|---|---|---|---|
| Size | INDUCTWISE | RLP | GKC | INDUCTWISE | RLP | GKC |
| 300 | .0013 | .0010 | .0017 | .1622 | .1266 | .1960 |
| 600 | .0014 | .0011 | .0014 | .4381 | .3452 | .4651 |
| 900 | .0006 | .0007 | .0008 | .3222 | .3076 | .4078 |
| 1200 | .0004 | .0004 | .0004 | .2382 | .2656 | .2992 |
| 1500 | .0003 | .0003 | .0004 | .2021 | .2200 | .2336 |

Figure 6:
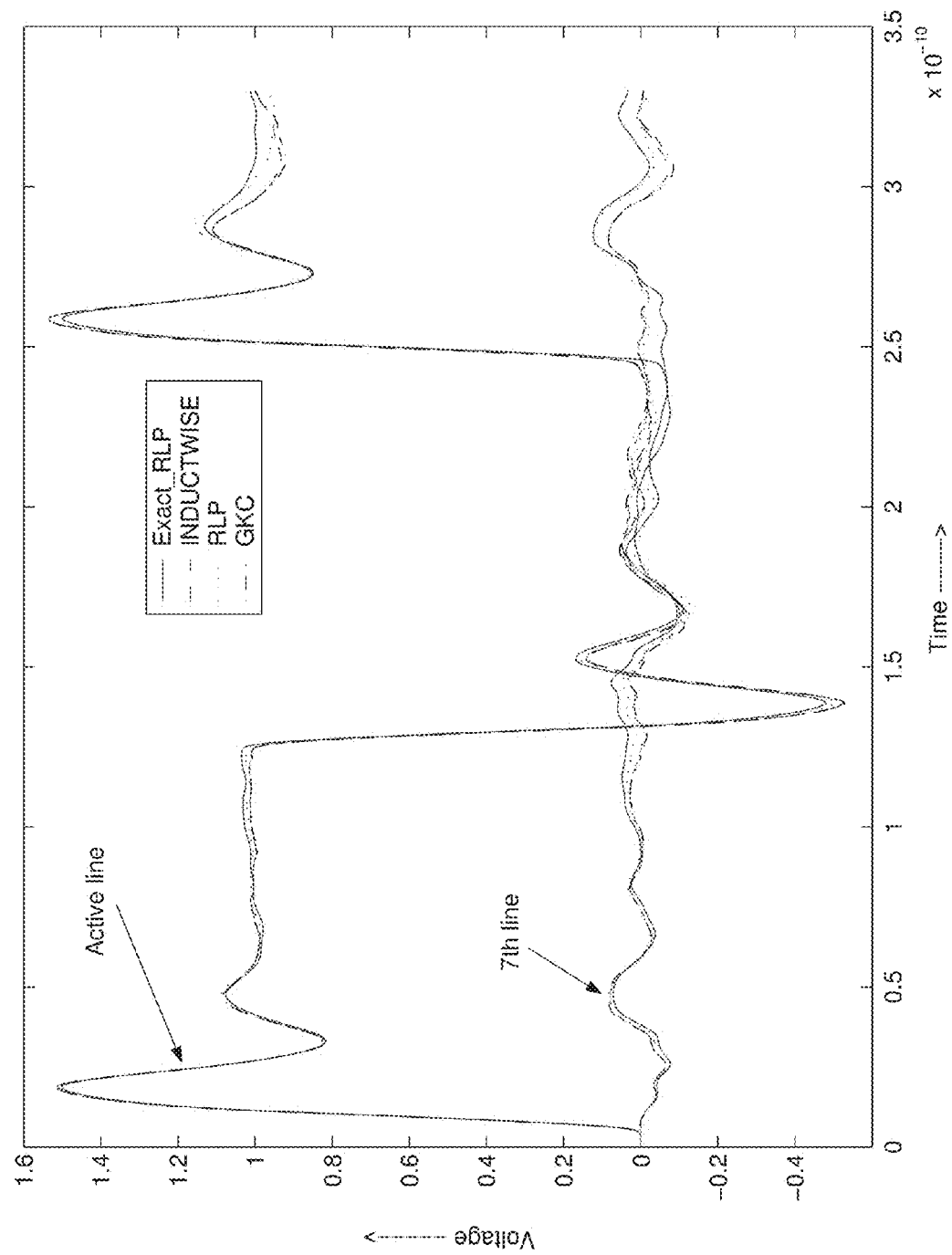
FIG. 6 shows the voltage wave forms, obtained through INDUCTWISE, Exact-RLP, RLP, and GKC, of the active line and the seventh line of a 600-conductor circuit.

It can be seen that the simulation accuracy of the RLP and the GKC algorithms are comparable to that of INDUCTWISE, with a marginally inferior performance as measured by the RMSE. A plot of the voltage waveforms at the far end of the active line and the 7th line, obtained by INDUCTWISE, RLP, and GKC algorithms, is shown in the FIG. 6.

Figure 7:
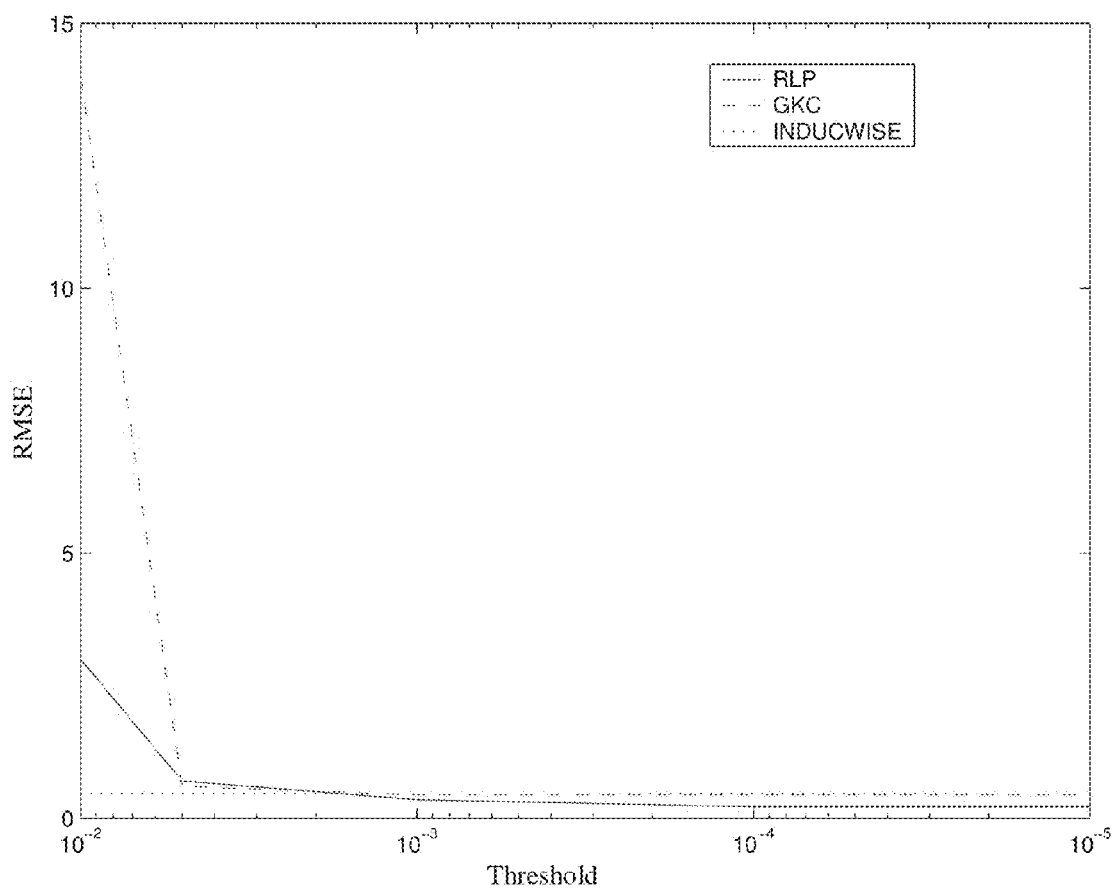
FIGS. 7 and 8 show plots of the RMSE for the active and the seventh line as a function of threshold value for a 600-conductor circuit.
Figure 8:
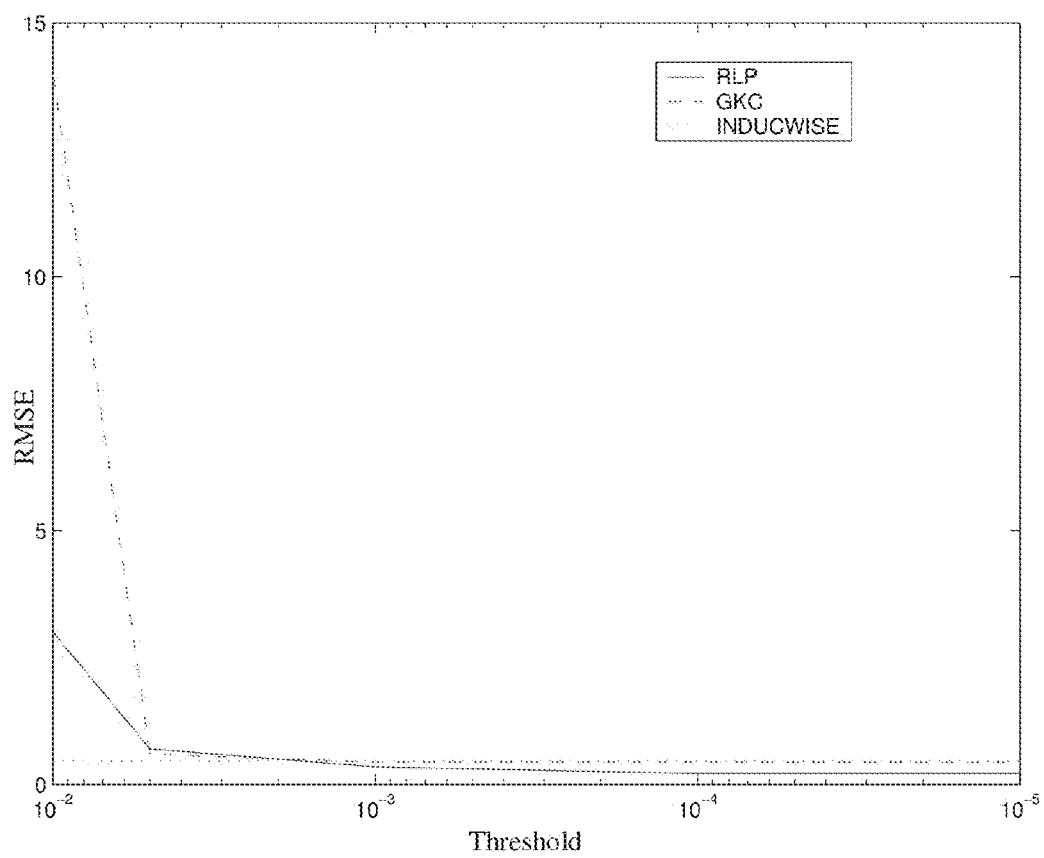

We briefly explore the influence the choice of the threshold for determining sparsity. A higher threshold can be expected to decrease the computational and memory requirements, however with loss in simulation accuracy. FIGS. 7 and 8 show plots of the RMSE for the active and seventh line as a function of threshold value, again for a circuit of size 600 conductors. Any value of the threshold below 0.001 appears to be a reasonable choice.

We now turn to a comparison of the computational and memory requirements between INDUCTWISE, RLP and GKC algorithms. Table 3 summarizes the findings.

TABLE 3

Run time and memory comparisons

| | Time (in sec) | | | | Memory (in MB) | | | |
|---|---|---|---|---|---|---|---|---|
| Size | Exact-RLP | INDUCTWISE | RLP | GKC | Exact-RLP | INDUCTWISE | RLP | GKC |
| 300 | 14.30 | 74.34 | 4.09 | 18.99 | 2.95 | 11.61 | 1.02 | 6.61 |
| 600 | 76.21 | 422.00 | 16.28 | 77.32 | 11.61 | 46.20 | 2.36 | 15.38 |
| 900 | 244.14 | 1133.40 | 33.21 | 162.08 | 26.03 | 103.84 | 4.09 | 31.68 |
| 1200 | 513.08 | 3051.10 | 60.53 | 312.93 | 46.20 | 184.56 | 6.16 | 52.22 |
| 1500 | 827.50 | 4682.00 | 92.16 | 813.00 | 72.14 | 288.24 | 7.60 | 86.00 |

It can be seen that for a circuit consisting of 1200 conductors, RLP is about nine times faster than the Exact-RLP, and fifty times faster than INDUCTWISE. The GKC algorithm is about twice as fast as the Exact-RLP, and ten times faster than INDUCTWISE. The Exact-RLP is about six times as fast as INDUCTWISE. With larger circuit sizes, the advantage of RLP over INDUCTWISE continues to grow, while the Exact-RLP and GKC algorithms have an advantage over INDUCTWISE that grows slightly. An explanation for the slower performance of INDUCTWISE compared to Exact-RLP is that the number of variables with the latter algorithm is one-half as that with the former. The same trends are observed with memory requirements.

VLSI interconnect structures with non linear devices can also be analyzed using the Modified Nodal Analysis (MNA) formulation, yielding equations of the form $$\tilde{G}x + \tilde{C}\dot{x} = b, \tag{9}$$

where $$\tilde{G} = \begin{bmatrix} \mathcal{G} & A_l^T \\ -A_l^T & 0 \end{bmatrix}, \tilde{C} = \begin{bmatrix} C & 0 \\ 0 & L \end{bmatrix}, x = \begin{bmatrix} v_n \\ i_l \end{bmatrix},$$

$$b = \begin{bmatrix} A_i^T I_s + I_{nl} \\ 0 \end{bmatrix}, \mathcal{G} = A_g^T R^{-1} A_g, \text{ and } C = A_c^T C A_c.$$

R denotes the resistance matrix. The matrices $\mathcal{G}$, L and C are the conductance, inductance and capacitance matrices respectively, with corresponding adjacency matrices $A_g$, $A_l$ and $A_c$. $I_s$ is the current source vector with adjacency matrix $A_i$, and $v_n$ and $i_l$ are the node voltages and inductor currents respectively.

Vector, $I_{nl}$ captures the effect of non-linear loads and depends on the node voltages as $I_{nl} = f(v_n)$. f is a function which varies depending on the load characteristics and in general can be a non-linear function.

Utilizing the trapezoidal method to numerically solve (9) requires the solution of a set of linear and non-linear equations:

$$\left(\frac{\tilde{G}}{2} + \frac{\tilde{C}}{h}\right) x^{k+1} = -\left(\frac{\tilde{G}}{2} - \frac{\tilde{C}}{h}\right) x^k + \frac{b^{k+1} + b^k}{2} \tag{10}$$

and $$I_{nl}^{k+1} = f(v_n^{k+1}). \tag{11}$$

The nonlinearity in the above set of equations can be handled by the standard Newton-Raphson technique of linearizing (11) and iterating until convergence: Equation (10) is a linear equation of the form $L(x)=0$, where we have omitted the iteration index k for simplicity. Equation (11) is a nonlinear equation of the form $g(x)=0$. Let $g(x) \approx G(x)$ be a linear approximation of $g(x)$, linearized around some $x=x_0$. Then, simultaneously solving $L(x)=0$ and $G(x)=0$ yields numerical values for x and hence $v_n$. These values are then used to obtain a new linear approximation $g(x) \approx G_{new}(x)$, and the process is repeated until convergence. A good choice of the point $x_0$ for the initial linearization at the kth time-step is given by the value of $v_n$ from the previous time-step.

A direct implementation of this algorithm requires $O(pqn_1^3)$ operations, where p is the number of time steps, q is the maximum number of Newton-Raphson iterations in each time step, and $n_1 = 3N$.

We begin by decomposing C, A, and $A_i$ as:

$$C = \begin{bmatrix} C_{cc} & C_{cv} \\ C_{vc} & C_{vv} \end{bmatrix}, A^T = \begin{bmatrix} A_1^T \\ A_2^T \end{bmatrix}, A_i^T = \begin{bmatrix} A_{i1}^T \\ A_{i2}^T \end{bmatrix}$$

$$I_{nl} = \begin{bmatrix} 0 \\ I_v \end{bmatrix} \cdot v_n = \begin{bmatrix} v_c \\ v_v \end{bmatrix}.$$

Here $C_{vv}$ denotes the sub-matrix of the capacitance matrix that changes amid the simulation, while all other sub-matrices remain constant. The matrix $C_{vv}$ captures the drain, gate and bulk capacitances of all devices, which are voltage-dependent, while $C_{cc}$, and $C_{cv}$ are the capacitance matrices that arise from interconnects and are hence constant.

For typical interconnect structures, the above decomposition allows us to manipulate the MNA equations (10) and (11):

$$\left(\frac{L}{h} + \frac{R}{2} + \frac{h}{4} A_1 P_{cc} A_1^T\right) I_l^{k+1} = \left(\frac{L}{h} - \frac{R}{2} - \frac{h}{4} A_1 P_{cc} A_1^T\right) I_l^k + A_1 v_c^k + \tag{12}$$

$$\frac{h}{4} A_1 P_{cc} A_{i1}^T (I_s^{k+1} + I_s^k) - A_1 P_{cc} C_{cv} (v_v^{k+1} - v_v^k) + \frac{A_2}{2} (v_v^{k+1} + v_v^k),$$

$$v_c^{k+1} = \tag{13}$$

$$v_c^k - \frac{h}{2} P_{cc} A_2^T (I_l^{k+1} + I_l^k) + \frac{h}{2} P_{cc} A_{i1}^T (I_s^{k+1} + I_s^k) - P_{cc} C_{cv} (v_v^{k+1} - v_v^k),$$

$$C_{vv} v_v^{k+1} = C_{vv} v_v^k - \frac{h}{2} A_2^T (I_l^{k+1} + I_l^k) + \tag{14}$$

$$\frac{h}{2} A_{i2}^T (I_s^{k+1} + I_s^k) - C_{vc} (v_c^{k+1} - v_c^k) + \frac{h}{2} (I_v^{k+1} + I_v^k),$$

$$I_v^{k+1} = f(v_v^{k+1}). \tag{15}$$

Here r denotes the size of interconnect structure connected directly to non linear circuit, and given $l = N - r$ we note that $$C_{cc} \in R^{l \times l}, C_{vv} \in R^{r \times r}.$$

$P_{cc} = C_{cc}^{-1}$ is the inverse capacitance matrix, and A is the adjacency matrix of the circuit. A is obtained by first adding $A_g$ and $A_l$ and then removing zero columns (these correspond to intermediate nodes, representing the connection of a resistance to an inductance).

Thus far, the analysis is similar to that of the linear elements structures described above, with the major difference being the addition of (14) and (15), which account for the nonlinear elements. We will show here how the linear techniques can be extended to handle the case when nonlinear elements are present.

For future reference, we will call the technique of directly solving (12), (13), (14), and (15) as the "Exact-RLP" algorithm. It can be shown that the computational complexity of the Exact-RLP algorithm is $O(l^3 + pq(l^2 + r^3))$. For large VLSI interconnect structures we have $l \gg r$, reducing the complexity to $O(l^3 + pq(l^2))$.

We now turn to the fast solution of equations (12) through (15). Recall that the nonlinear equation (15) is handled via the Newton-Raphson technique. This requires, at each time step, linearizing (15) and substituting it into (14). The resulting set of linear equations have very specific structure:

Equations (12) and (13) are of the form $Ax=b$ where A is fixed (does not change with the time-step). Moreover, $A^{-1}$ is typically approximately sparse.

Equation (14) (after the substitution of the linearized (15)) is again of the form $Ax=b$, where the matrix A is obtained by adding $C_{vv}$ and the coefficient of the first-order terms in the linearized equation (15). Recall that the matrix $C_{vv}$ captures the drain, gate and bulk capacitances of all devices. It also contains the interconnect coupling capacitances between gates and drains of different non-linear devices in the circuit. As each non-linear device is connected to only a few nodes and the capacitive effects of interconnects are localized, the A matrix is observed to be sparse in practice. Note that A changes with each Newton-Raphson iteration and with the time-step.

Thus the key computational problem is the solution of a sparse time-varying set of linear equations, coupled with a large fixed system of linear equations $Ax=b$ with $A^{-1}$ being sparse.

Krylov subspace methods have been shown to work extremely well for sparse time-varying linear equations. Specifically, the GMRES (Generalized Minimum Residual) method of Saad and Schultz allows the efficient solution of a sparse, possibly non-symmetric, linear system to within a pre-specified tolerance. This method performs a directional search along the orthogonal Arnoldi vectors which span the Krylov subspace of A. That is, given an initial guess $x_0$ and corresponding residual $r_0=b-Ax_0$, orthogonal vectors $\{q_1, q_2, \ldots, q_m\}$ are generated with the property that they span $S_m$, the solution search space at iteration m.

$$S_m = x_0 + \text{span}\{r_0, Ar_0, \ldots, A^m r_0\} \quad (16)$$
$$= x_0 + \kappa(A, r_0, m)$$
$$\subseteq \text{span}\{q_1, q_2, \ldots, q_m\}.$$

These vectors are chosen according to the Arnoldi iteration: $AQ_m = Q_{m+1} H_m$ where $Q_m = \{q_1, q_2, \ldots, q_m\}$ is orthogonal and $H_m \in R^{m+1 \times m}$ is an upper Heisenberg matrix.

For these methods the choice of a preconditioner matrix M, which is an approximation of A, can greatly affect the convergence. A good preconditioner should have the following two properties:

$M^{-1}A \approx I$.

It must accommodate a fast solution to an equation of the form $Mz=c$ for a general c.

Figure 9:
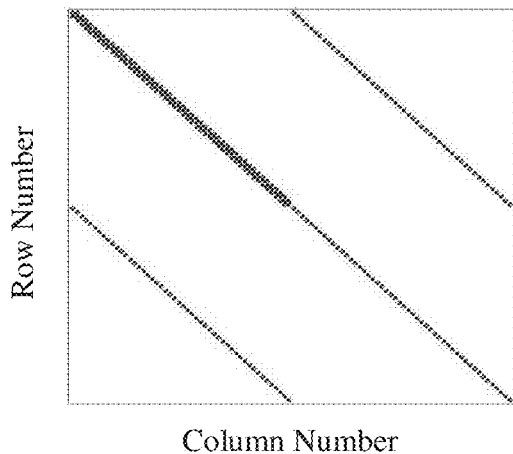
FIG. 9 shows the sparsity structure (nonzero entries shown darker) of the A matrix for an exemplary circuit of parallel wires driving a bank of inverters.
Figure 10:
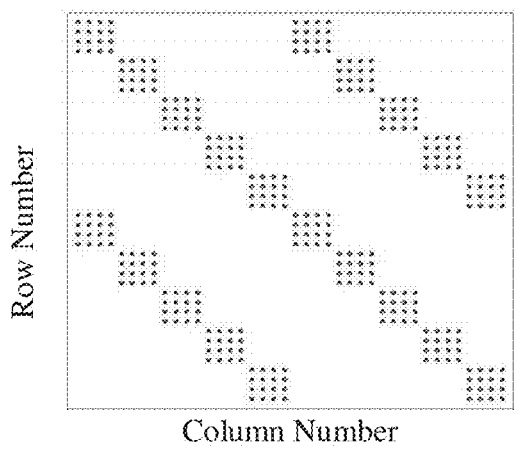
FIG. 10 shows an exemplary preconditioner matrix that may be used with the exemplary circuit of FIG. 9.
Figure 11:
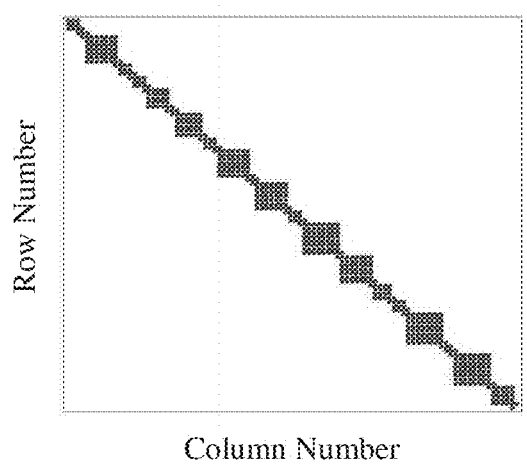
FIG. 11 shows the sparsity pattern (nonzero entries shown darker) of matrix A of a circuit having only non-linear devices and no interconnects.

FIG. 9 depicts the sparsity structure of the A matrix for a circuit example of parallel wires driving a bank of inverters. For such a sparsity structure, an appropriate choice of the preconditioner could be of the form as shown in FIG. 10. Although we have chosen a circuit with only inverters for simplicity, a more complicated circuit structure would simply distribute the entries around the diagonal and off-diagonal bands and lead to possibly more off diagonal bands. To see this, consider an extreme case where the circuit under consideration has only non-linear devices and does not comprise of interconnects. In this case the sparsity pattern of the A matrix is as shown in FIG. 11. Therefore, the chosen preconditioner would encompass not only the sparsity structure shown in FIG. 9 but also other sparsity patterns that might arise with the analysis of more complicated non-linear devices. Correspondingly the structure of the preconditioner (see FIG. 10) would have additional bands.

Matrices of the form shown in FIG. 10 have the following two properties which make them an ideal choice for preconditioner.

The inverses of the preconditioner matrix can be computed efficiently in linear time, O(r) (r denotes the size of interconnect structure directly connected to non-linear devices), by exploiting the Hadamard product formulation.

It can also be shown that this formulation facilitates the fast matrix-vector products, again in linear time (O(r)), which arise while solving linear systems of equations with the preconditioner matrix.

A simple example which best illustrates these advantages is a symmetric tridiagonal matrix.

$$B = \begin{pmatrix} a_1 & -b_1 & & & \\ -b_1 & a_2 & -b_2 & & \\ & \ddots & \ddots & \ddots & \\ & & -b_{n-2} & a_{n-1} & -b_{n-1} \\ & & & -b_{n-1} & a_n \end{pmatrix} \quad (17)$$

The inverse of B can be represented compactly as a Hadamard product of two matrices, which are defined as follows:

$$B^{-1} = \underbrace{\begin{pmatrix} u_1 & u_1 & \cdots & u_1 \\ u_1 & u_2 & \cdots & u_2 \\ \vdots & \vdots & \ddots & \vdots \\ u_1 & u_2 & \cdots & u_n \end{pmatrix}}_{U} \circ \underbrace{\begin{pmatrix} v_1 & v_1 & \cdots & v_n \\ v_2 & v_2 & \cdots & v_n \\ \vdots & \vdots & \ddots & \vdots \\ v_n & v_n & \cdots & v_n \end{pmatrix}}_{V} \quad (18)$$

There exists an explicit formula to compute the sequences $\{u\}, \{v\}$ efficiently in O(n) operations. In this case, if we are interested in solving a linear system of equations $By=c$, we only need to concern ourselves with the matrix-vector product $B^{-1}c=y$. This computation can also be performed efficiently in O(n) computations as outlined below:

$$P_{u_i} = \sum_{j=1}^{i} u_j c_j, \quad P_{v_i} = \sum_{j=1}^{n} v_j c_j, \quad i = 1, \ldots, n \quad (19)$$

$$y_1 = u_1 P_{v_1},$$

$$y_i = v_i P_{u_{i-1}} + u_i P_{v_i}, \quad i = 2, \ldots, n.$$

The above formulation for a tridiagonal matrix could be easily extended to handle the more general case when the preconditioner matrix is a zero padded block tridiagonal matrix (matrix with zero diagonals inserted between the main diagonal and the non-zero super-diagonal and sub-diagonal of tridiagonal matrix) as in FIG. 10. Elementary row and column block permutations could be performed on such a matrix to reduce it into a block tridiagonal matrix. This has been shown with a small example as below.

$$B = \begin{pmatrix} a_1 & 0 & -b_1 & 0 \\ 0 & a_2 & 0 & -b_2 \\ -b_1 & 0 & a_3 & 0 \\ 0 & -b_2 & 0 & a_4 \end{pmatrix} \quad (20) \text{ and } (21)$$

$$= P \underbrace{\begin{pmatrix} a_1 & -b_1 & 0 & 0 \\ -b_1 & a_2 & 0 & 0 \\ 0 & 0 & a_3 & -b_2 \\ 0 & 0 & -b_2 & a_4 \end{pmatrix}}_{X} P^T,$$

-continued where $$P = \begin{pmatrix} 1 & 0 & 0 & 0 \\ 0 & 0 & 1 & 0 \\ 0 & 1 & 0 & 0 \\ 0 & 0 & 0 & 1 \end{pmatrix}.$$

Hence, $$B^{-1} = PX^{-1}P^T = \underbrace{\begin{pmatrix} u_1 & 0 & u_1 & 0 \\ 0 & u_2 & 0 & u_2 \\ u_1 & 0 & u_3 & 0 \\ 0 & u_2 & 0 & u_4 \end{pmatrix}}_{U} \circ \underbrace{\begin{pmatrix} v_1 & 0 & v_3 & 0 \\ 0 & v_2 & 0 & v_4 \\ v_3 & 0 & v_3 & 0 \\ 0 & v_4 & 0 & v_4 \end{pmatrix}}_{V}. \quad (22)$$

We have not included block matrices for simplicity of presentation, however the zero padded block tridiagonal case is a natural extension of the above example. All the entries in U,V matrices have to be now replaced by blocks and accordingly the row and column permutations would be replaced by their block counterparts with an identity matrix of appropriate size replacing the 'ones' in the P matrix. Table 4 gives the comparison for Incomplete-LU preconditioner and the zero-padded (Z-Pad) preconditioner. Simulations were done on circuits consisting of busses with parallel conductors driving bank of inverters. 'Size' denotes the number of non-linear devices. All the results are reported as a ratio of run-time and iteration-count (number of iterations for the solution to converge to within a tolerance of 1e-10) of Z-Pad to the Incomplete-LU preconditioner. As can be seen from Table 4, Z-Pad offers a substantial improvement in run time as compared to the Incomplete-LU preconditioner.

TABLE 4

Preconditioner comparison.

| | Size | | | |
|---|---|---|---|---|
| | 400 | 800 | 1600 | 3200 |
| Runtime | .44 | .42 | .42 | .43 |
| Iterations | 5/10 | 5/10 | 5/10 | 5/10 |

We now turn to the solution of equations (12) and (13). As mentioned earlier, these equations reduce to the form Ax=b with a constant, approximately sparse $A^{-1}$. A (corresponding to X in (12) is composed of L, R and P. Each of these matrices has a sparse inverse for typical VLSI interconnects which then leads to a approximately sparse $A^{-1}$ (Note that this argument is used for motivating the sparsity inherent in $A^{-1}$ and cannot be used as a theoretical proof for the same). In addition this sparsity has a regular pattern which can be explained on the basis of how inductance and capacitance matrices are extracted. The distributed RLC effects of VLSI interconnects can be modeled by dividing conductors into small subsets of segments, each of which are aligned. Each of these subsets leads to a sparsity pattern (corresponding to a band in $A^{-1}$). All the effects when summed up lead to a $A^{-1}$ matrix that has a regular sparsity pattern. Window selection algorithm can then be employed to find out the sparsity pattern in $A^{-1}$. It has been recognized in earlier work that this property (sparsity) yields enormous computational savings; it has been shown that an approximate implementation of the Exact-RLP algorithm, referred to simply as the "RLP algorithm" provides an order-of-magnitude in computational savings with little sacrifice in simulation accuracy.

To proceed, we rewrite (12) and (13) as $$i_l^{k+1} = X^{-1}Yi_l^k + X^{-1}A_1v_c^k + \frac{h}{4}X^{-1}A_1P_{cc}A_{i1}^T(I_s^{k+1} + I_s^k) - \quad (23)$$
$$X^{-1}A_1P_{cc}C_{cv}(v_v^{k+1} - v_v^k) + \frac{A_2}{2}(v_v^{k+1} + v_v^k),$$

$$X^{-1}A_1v_c^{k+1} = X^{-1}A_1v_c^k - X^{-1}A_1\frac{h}{2}P_{cc}A_2^T(i_l^{k+1} + i_l^k) + \quad (24)$$
$$\frac{h}{2}X^{-1}A_1P_{cc}A_{i1}^T(I_s^{k+1} + I_s^k) - X^{-1}A_1P_{cc}C_{cv}(v_v^{k+1} - v_v^k).$$

Figure 12:
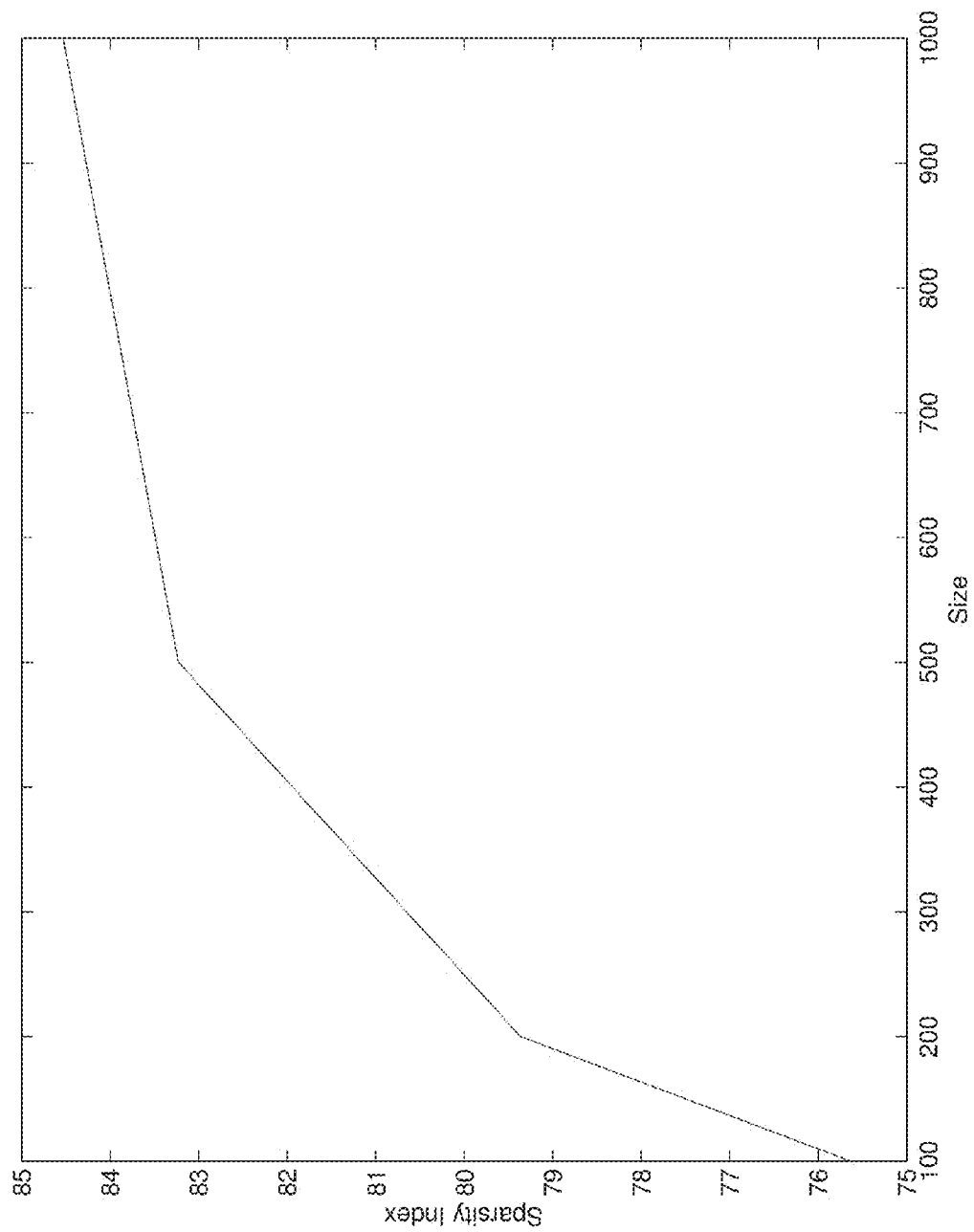
FIG. 12 shows average sparsity versus circuit size.

Although X is a dense matrix, $X^{-1}$ turns out to be an approximately sparse matrix. Moreover the matrices $X^{-1}Y$, $X^{-1}A_1$, $X^{-1}A_1P_{cc}A_{i1}^T$, $X^{-1}A_1P_{cc}C_{cv}$ are also approximately sparse. This information can be used to reduce the computation significantly by noting that each step of trapezoidal integration now requires only sparse vector multiplications. Solving sparse (23) and (24) along with (15) and (16) is termed as the RLP algorithm (SASIMI). To analyze the computational saving of the approximate algorithm over the Exact-RLP algorithm, we denote "sparsity index" of a matrix A as ratio of the number of entries of A with absolute value less than $\epsilon$ to the total number of entries. The computation required for each iteration of (23) and (24) is then $O((1-v)l^2)$, where v is the minimum of the sparsity indices the matrices $X^{-1}Y$, $X^{-1}A_1$, $X^{-1}A_1P_{cc}A_{i1}^T$, $X^{-1}A_1P_{cc}C_{cv}$. FIG. 12 provides the average sparsity for the matrices for a system with parallel conductors driving a bank of inverters. The sizes in consideration are 100, 200, 500 and 1000. On top of this the computation time of can be reduced to O(1) by using the windowing techniques (details in [16]). Hence the computational complexity of RLP is $O(pq(1-v)l^2)$ as compared to $O(pqn_1^3)$ for the MNA approach.

We implemented the Exact-RLP and RLP (SASIMI) algorithms in C++. A commercially available version of SPICE with significant speed-up over the public-domain SPICE has been used for reporting all results with SPICE. Simulations were done on circuits consisting of busses with parallel conductors driving bank of inverters, with wires of length 1 mm, cross section 1 μm×1 μm, and with a wire separation of 1 μm. A periodic 1V square wave with rise and fall times of 6 ps each was applied to the first signal with a time period of 240 ps. All the other lines were assumed to be quiet. For each wire, the drive resistance was 10Ω. A time step of 0.15 ps was taken and the simulation was performed over 30 ps (or 200 time steps). For the inverters the W/L ratio of NMOS and PMOS were taken to be 0.42 μm/0.25 μm and 1.26 μm/0.25 μm respectively.

In order to explore the effect of the number of non-linear elements relative to the total, three cases were considered. With ρ denoting the ratio of the number of linear elements to that of non-linear elements, the experiments were performed for ρ equaling 5, 20 and 50. The number of linear elements in the following results is denoted by σ.

We first present results comparing the accuracy in simulating the voltage waveforms at the far end of the first line (after the inverter load). The RMSE is again use for comparing the simulations, defined here as $$\frac{\sum_i (v_i - \tilde{v}_i)^2}{\sum_i v_i^2}$$

where v and $\tilde{v}$ denote the waveforms obtained from Exact-RLP and SASIMI respectively.

Figure 13:
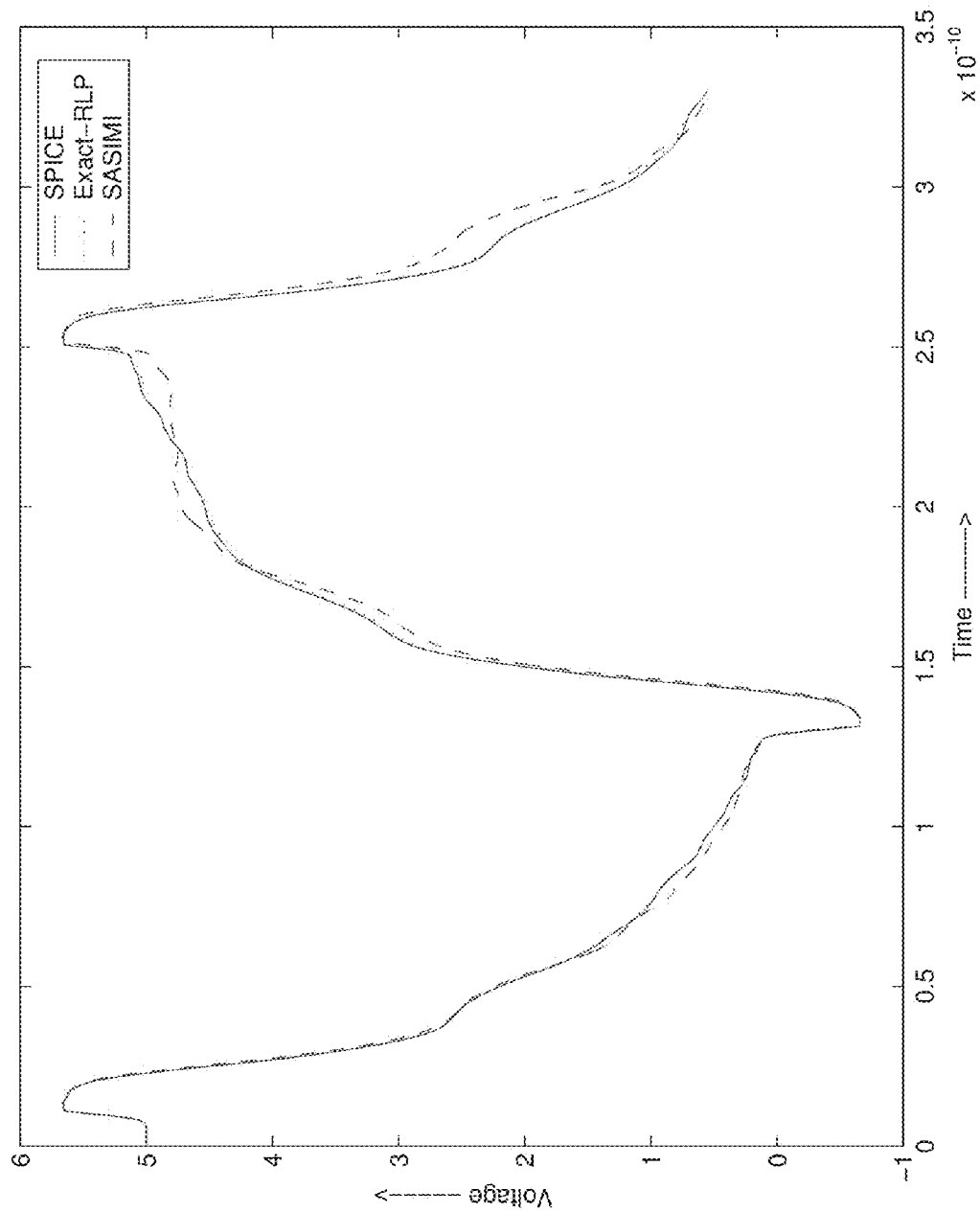
FIG. 13 shows the voltage wave form obtained through SPICE and Exact-RLP and SASIMI.

Table 5 presents a summary of the results from the study of simulation accuracy. It can be seen that the simulation accuracy of the Exact-RLP algorithm is almost identical to that of SPICE, while the SASIMI has a marginally inferior performance as measured by the RMSE. The error values for SASIMI are compared simply with the Exact-RLP as it had the same accuracy as SPICE results for all the experiments run. A plot of the voltage waveforms at the far end of the active line, obtained from SPICE, Exact-RLP and SASIMI algorithms, is shown in FIG. 13. (The number of conductors in this simulation example is 200.) There is almost no detectable simulation error between the SASIMI, Exact-RLP and SPICE waveforms over 200 time steps. To give a better picture, the accuracy results reported are for a larger simulation time of 2200 time steps.

TABLE 5

RMSE comparison.

| σ | ρ = 5 | ρ = 20 | ρ = 50 |
|---|---|---|---|
| 100 | .0054 | .0053 | .0088 |
| 200 | .0078 | .0052 | .0071 |
| 500 | .0006 | .0022 | .0001 |
| 1000 | .0003 | .0005 | .0004 |
| 2000 | .0003 | .0004 | .0004 |

We now turn to a comparison of the computational requirements between Exact-RLP, SASIMI and SPICE. Table 6 summarizes the findings. For a fair comparison, our total simulation time is compared against the transient simulation time for SPICE (i.e we have not included any of the error check or set up time for SPICE). As can be seen from the table, SASIMI outperforms the Exact-RLP algorithm and SPICE. For the case of 500 conductors with ρ=50, the Exact-RLP algorithm is 390 times as fast compared to SPICE. SASIMI is about 1400 times faster as compared to SPICE, and more than three times faster than Exact-RLP. As can be seen, the computational savings increase as the ratio of linear to non-linear elements is increased from 5 to 50. The savings also increase with increase in the size of the problem considered. The computational efficiency of the SASIMI can be explained on the use of sparsity-aware algorithms for both the linear and non-linear parts of the problem.

TABLE 6

Run time (in seconds) comparisons.

| | ρ = 5 | | | ρ = 20 | | | ρ = 50 | | |
|---|---|---|---|---|---|---|---|---|---|
| σ | SPICE | Exact-RLP | SASIMI | SPICE | Exact-RLP | SASIMI | SPICE | Exact-RLP | SASIMI |
| 100 | 11.96 | 1.34 | 1.26 | 13.73 | .27 | .21 | 13.54 | .15 | .12 |
| 200 | 100.25 | 3.28 | 2.68 | 68.72 | .64 | .28 | 67.68 | .55 | .22 |
| 500 | 3590.12 | 17.13 | 4.872 | 1919.21 | 13.47 | 3.01 | 1790.67 | 4.58 | 1.30 |
| 1000 | >12 hrs | 87.75 | 22.71 | >10 hrs | 79.07 | 16.49 | >10 hrs | 77.56 | 15.20 |
| 2000 | >1 day | 545.6 | 78.06 | >1 day | 526.23 | 59.33 | >1 day | 408.54 | 56.05 |

The existing methods for finding the inverse of a block tridiagonal matrix suffer from being either numerically unstable or heavily memory intensive and hence impractical for problems of very large size (e.g. $10^6 \times 10^6$).

Figure 14:
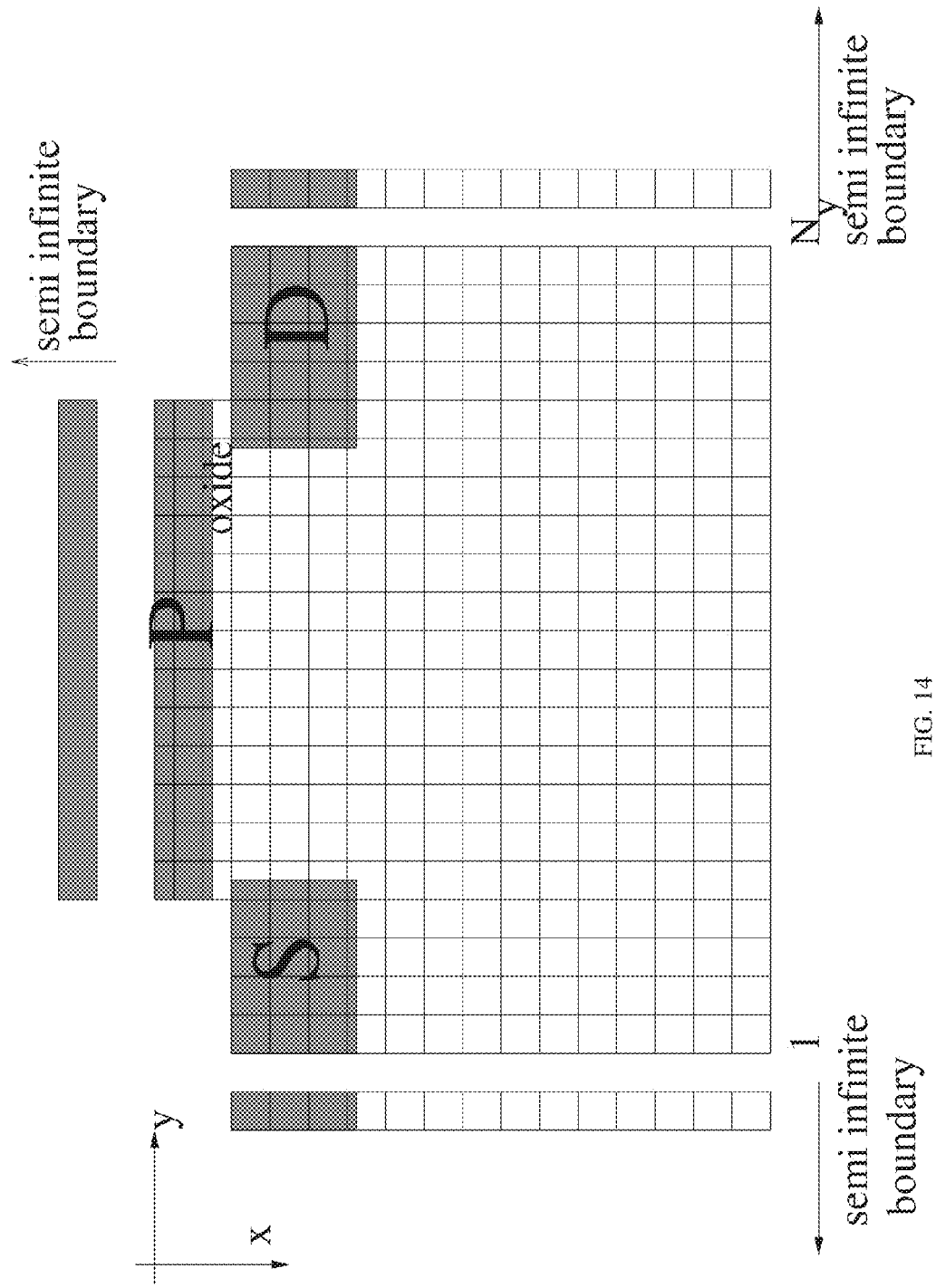
FIG. 14 shows a two dimensional non-uniform spatial grid for a Nanotransistor.

Consider the two-dimensional model of a nano-scale transistor, shown in FIG. 14. The body of the transistor is projected onto a two-dimensional non-uniform spatial grid of dimension $N_x \times N_y$, where $N_x(N_y)$ denote the number of grid points along the depth (length) of the device. A brief review of the governing physics of this device is provided here.

The Hamiltonian of a valley b for electrons, associated with the device under consideration, is as follows:

$$H_b(r) = -\frac{\hbar}{2}\left[\frac{d}{dx}\left(\frac{1}{m_x^b}\frac{d}{dx}\right) + \frac{d}{dy}\left(\frac{1}{m_y^b}\frac{d}{dy}\right) + \frac{d}{dz}\left(\frac{1}{m_z^b}\frac{d}{dz}\right)\right] + V(r), \quad (25)$$

where $(m_x^b, m_y^b, m_z^b)$ are the components of effective mass in valley b. The equation of motion for the retarded Green's function ($G^r$) and less-than Green's function ($G^<$) are:

$$\left[E - \frac{\hbar^2 k_z^2}{2m_z} - H_b(r_1)\right]G_b^r(r_1, r_2, k_z, E) - \quad (26)$$

$$\int dr \sum_b^r (r_1, r_2, k_z, E) G_b^r(r_1, r_2, k_z, E) = \delta(r_1 - r_2),$$

$$\left[E - \frac{\hbar^2 k_z^2}{2m_z} - H_b(r_1)\right]G_b^<(r_1, r_2, k_z, E) - \quad (27)$$

$$\int dr \sum_b^r (r_1, r_2, k_z, E) G_b^<(r_1, r_2, k_z, E) =$$

$$\int dr \sum_b^< (r_1, r_2, k_z, E) G_b^a(r_1, r_2, k_z, E).$$

Given $G^r$ and $G^<$, the density of states and the charge density can be written as a sum of contributions from the individual valleys, $$N(r, k_z, E) = \sum_b N_b(r, k_z, E) = -\frac{1}{\pi}\text{Im}[G_b^r(r, r, k_z, E)], \quad (28)$$

$$\rho(r, k_z, E) = \sum_b \rho_b(r, k_z, E) = -i[G_b^<(r, r, k_z, E)]. \quad (29)$$

The self-consistent solution of the Green's function is often the most time intensive step in the simulation of electron density. It was shown by Svizhenko et al. in "Two-dimensional quantum mechanical modeling of nanotransistors," Journal of Applied Physics, 91(4):2343-2354, 2002, hereby incorporated by reference, that the approximate block tridiagonal structure of the left-hand side in (26) and (27) facilitates the efficient calculation of the electron density. Specifically, it was demonstrated that only the diagonal entries of $G^r$ are needed to be computed for such a simulation.

Svizhenko et al. showed that the problem of computing electron densities in a nanotransistor can be reduced to finding the diagonal blocks of $G^r$, where $AG^r=I$ and A is a block tridiagonal matrix of the form $$A = \begin{pmatrix} A_1 & -B_1 & & & \\ -B_1^T & A_2 & -B_2 & & \\ & \ddots & \ddots & \ddots & \\ & & -B_{N_y-2}^T & A_{N_y-1} & -B_{N_y-1} \\ & & & -B_{N_y-1}^T & A_{N_y} \end{pmatrix}, \quad (30)$$

where each $A_i$, $B_i \in \mathbb{C}^{N_x \times N_x}$. Thus $A \in \mathbb{C}^{N_y N_x \times N_y N_x}$, with $N_y$ diagonal blocks of size $N_x$ each. We will denote A compactly as $A=\text{trid}(A_i, B_i)$.

The algorithm in Svizhenko et al. calculates the diagonal blocks ($D_i$) of $A^{-1}$ in the following manner.

$$G_1 = A_1^{-1},$$

$$G_{i+1} = (A_{i+1} - B_i G_i B_i)^{-1}, \quad i=1, 2, \ldots, N_y-1,$$

$$D_{N_y} = G_{N_y},$$

$$D_i = G_i + G_i B_i D_{i+1} B_i G_i, \quad i = N_y-1, N_y-2, \ldots, 1. \quad (31)$$

The time complexity of this algorithm was shown to be $O(N_x^3 N_y)$, with a memory requirement of $O(N_x^3 N_y)$.

Alternatively, the inverse of a block tridiagonal matrix can be computed explicitly by exploiting the Hadamard product formulation. When $\{B_i\}$ are non-singular, A is said to be proper. In this case there exists two (non-unique) sequences of matrices $\{U_i\}, \{V_i\}$ such that for $j \geq i$, $(A^{-1})_{ij} = U_i V_j^T$.

Hence, $A^{-1}$ can be written as $$A^{-1} = \begin{pmatrix} U_1 V_1^T & U_1 V_2^T & U_1 V_3^T & \ldots & U_1 V_{N_y}^T \\ V_2 U_1^T & U_1 V_2^T & U_2 V_3^T & \ldots & U_2 V_{N_y}^T \\ V_3 U_1^T & V_3 U_2^T & U_3 V_3^T & \ldots & U_3 V_{N_y}^T \\ \vdots & \vdots & \vdots & \ddots & \vdots \\ V_{N_y} U_1^T & V_{N_y} U_2^T & V_{N_y} U_3^T & \ldots & U_{N_y} V_{N_y}^T \end{pmatrix}.$$

The U and V sequences can be efficiently computed in $O(N_y N_x^3)$ operations in the following manner:

$$U_1 = I, \quad U_2 = B_1^{-1} A_1,$$

$$U_{i+1} = B_i^{-1}(A_i U_i - B_{i-1}^T U_{i-1}), \quad i=2, \ldots, N_y-1,$$

$$V_{N_y}^T = (A_{N_y} U_{N_y} - B_{N_y-1}^T U_{N_y-1})^{-1},$$

$$V_{N_y-1}^T = V_{N_y}^T A_{N_y} B_{N_y-1}^{-1},$$

$$V_i^T = (V_{i+1}^T A_{i+1} - V_{i+2}^T B_{i+1}^T), \quad i=N_y-2, \ldots, 2, 1. \quad (32)$$

I denotes identity matrix of appropriate size.

The matrices encountered in the simulation of nanotransistors enjoy the property that the diagonal blocks $\{A_i\}$ are tridiagonal while the off-diagonal blocks $\{B_i\}$ are diagonal (this is due to the tight-binding approximation of the Hamiltonian). The complexity of the above parameterization is then reduced to $O(N_y N_x^2 + N_x^3)$. It is worthwhile to note here that the complexity of algorithm in (31), which was given to be $O(N_y N_x^3)$, does not change based upon these properties (although the actual run time is reduced). Therefore, the reduced complexity of the Hadamard formulation makes it an ideal choice for the solution of this problem. However, it has been shown that the above recursions can be numerically unstable for large problem sizes. This will preclude it from being directly implemented to solve these problems. Alternatively, the divide and conquer algorithm described below avoids these numerical issues by only handling manageable problem sizes at each step.

In the most simple case, the block tridiagonal matrix, A can be decomposed into two sub-matrices connected by what we will call a bridge matrix. This concept is illustrated below:

$$A = \tilde{A} + XY,$$

$$\tilde{A} = \begin{pmatrix} S_1 & \\ & S_2 \end{pmatrix},$$

$$S_1 = \begin{pmatrix} A_1 & -B_1 & & & \\ -B_1^T & A_2 & -B_2 & & \\ & \ddots & \ddots & \ddots & \\ & & -B_{i-2}^T & A_{i-1} & -B_{i-1} \\ & & & -B_{i-1}^T & A_i \end{pmatrix},$$

$$S_2 = \begin{pmatrix} A_{i+1} & -B_{i+1} & & & \\ -B_{i+1}^T & A_{i+2} & -B_{i+2} & & \\ & \ddots & \ddots & \ddots & \\ & & -B_{N_y}^T-2 & A_{N_y-1} & -B_{N_y-1} \\ & & & -B_{N_y-1}^T & A_{N_y} \end{pmatrix},$$

$$X = \begin{pmatrix} 0 & 0 \\ \vdots & \vdots \\ -B_i & 0 \\ 0 & -B_i^T \\ \vdots & \vdots \\ 0 & 0 \end{pmatrix}, \quad Y = \begin{pmatrix} 0 & \ldots & 0 & I & \ldots & 0 \\ 0 & \ldots & I & 0 & \ldots & 0 \end{pmatrix}.$$

Notice that the block tridiagonal structure is preserved in each sub-problem, and they are joined by the $N_x \times N_x$ bridge matrix $B_i$. The structure of $S_1$ and $S_2$ facilitates the use of Hadamard based methods (32) for determining the solution of each sub-problem. However, the question then becomes how to determine the global solution from each sub-problem solution and their corresponding bridge. This problem can be resolved by the use of a fundamental result of linear algebra. The matrix inversion lemma describes the effect of a low rank correction term on the inverse of a matrix, and can be used in the following way:

$$A^{-1} = (\tilde{A} + XY)^{-1} \quad (33)$$

$$= \tilde{A}^{-1} - (\tilde{A}^{-1} X)(I + Y \tilde{A}^{-1} X)^{-1}(Y \tilde{A}^{-1})$$

where, $$\tilde{A}^{-1} X = \begin{pmatrix} (-C_1 B_i) & 0 \\ 0 & (-C_2 B_i^T) \end{pmatrix},$$

$$(I + Y \tilde{A}^{-1} X)^{-1} = \begin{pmatrix} I & -S_2^{-1}(1,1) B_i^T \\ -S_1^{-1}(i,i) B_i & I \end{pmatrix}^{-1},$$

-continued $$Y\tilde{A}^{-1} = \begin{pmatrix} 0 & (C_2^T) \\ (C_1^T) & 0 \end{pmatrix}.$$

Here, $C_1 = S_1^{-1}(:,i)$ and $C_2 = S_2^{-1}(:,1)$ denotes the last (first) block columns of $S_1^{-1}(S_2^{-1})$ respectively.

Although (33) can be used directly to solve the problem described above, its lack of computational efficiency precludes its use in this case. However, it is important to note that the adjustment term, $(I + Y\tilde{A}^{-1}X)^{-1}$, depends only on the corner blocks of the inverses of the sub-problems. This observation provides the basis for a formulation of the solution for the more general case. Specifically, the divide and conquer algorithm of the present invention addresses the issue of how to combine multiple sub-problem solutions in both a memory and computationally efficient manner.

An overview of the divide and conquer algorithm is provided here.

The procedure begins with separating the block tridiagonal matrix A into D subproblems, each joined by a bridge matrix. The procedure presented previously motivates the formulation of the global solution by combining the sub-problems in a simple radix 2 fashion. However, this method offers no improvement in terms of memory consumption and is computationally intensive. Alternatively, matrix maps are created to capture the effect of each combining step without performing all of the associated computation. Adjustments to the matrix maps at each combining stage are not constant and must be modified to parallel the procedure above. These maps can then be used in the final stage to transform the subproblem solutions into the global solution.

Each combining step in the divide and conquer algorithm will have an associated entry in the "job" list pointing to the first and last sub-problems along with the corresponding bridge point. For example, (1~2,3~4) describes the action of combining joined sub-problems 1 and 2 ($S_{1-2}$) to joined sub-problems 3 and 4 ($S_{3-4}$) by use of the bridge matrix between problems 2 and 3. The corresponding entry in the job list would be of the form: [start, stop, bridge]=[1, 4, 2].

This formulation lends itself directly to parallel implementation, since computations associated with non-overlapping combinations can be farmed out across multiple systems.

To model the effect of any combining stage in the job list, it is necessary to know the corner block elements from the inverse of each combined sub-problem. This process can be easily illustrated by a simple example. Suppose once again that the combination stage is (1~2,3~4), let $Q_1 = S_{1-2}$ and $Q_2 = S_{3-4}$. The corner block elements of $Q_1^{-1}$ and $Q_2^{-1}$ can be found using the parameterization given in (32).

$$Q^{-1} = \begin{pmatrix} Q_1^{-1} & 0 \\ 0 & Q_2^{-1} \end{pmatrix}$$

$$= \begin{pmatrix} [\tilde{U}_1 \tilde{V}_1^T] & \cdots & [\tilde{U}_1 \tilde{V}_n^T] & & & \\ \vdots & \ddots & \vdots & & 0 & \\ & \cdots & [\tilde{U}_n \tilde{V}_n^T] & & & \\ & & & [\hat{U}_1 \hat{V}_1^T] & \cdots & [\hat{U}_1 \hat{V}_m^T] \\ & 0 & & \vdots & \ddots & \vdots \\ & & & & \cdots & [\hat{U}_m \hat{V}_m^T] \end{pmatrix},$$

where n=size($S_1$)+size($S_2$), and m=size($S_3$)+size($S_4$).

It would be impractical to recalculate the inverse of each joined problem for each combining stage. Alternatively, matrix maps are used to efficiently produce the required block entries.

Matrix maps are created to produce the cumulative effect of each combining step associated with a particular sub-problem. There are a total of eight $N_x \times N_x$ matrix maps $\{M_i\}$ for each sub-problem. The process of updating matrix maps can be broken down into two categories: Adjustments to Upper sub-problem and those to Lower sub-problems, the distinction being their location with respect to the bridge point. This procedure will be illustrated using the above example. The "adjustment" matrix, ADJ, for the combining step is defined as follows:

$$Z_1 = -B_{n+1}^T \hat{U}_1 \hat{V}_1^T, \qquad (34)$$
$$Z_2 = -B_{n+1} \tilde{U}_n \tilde{V}_n^T,$$
$$P = (I - Z_2 Z_1)^{-1},$$
$$ADJ = \begin{pmatrix} I + Z_1 P Z_2 & -Z_1 P \\ -P Z_2 & P \end{pmatrix} = \begin{pmatrix} ADJ_{11} & ADJ_{12} \\ ADJ_{21} & ADJ_{22} \end{pmatrix}$$

The matrix maps associated with the Upper sub-problems ($S_1$ and $S_2$) are updated in the following manner.

$M_1 + (\tilde{U}_1 \tilde{V}_n^T ADJ_{12} B_{n+1}) M_3 \rightarrow M_1$ $M_2 (\tilde{U}_1 \tilde{V}_n^T ADJ_{12} B_{n+1}) M_4 \rightarrow M_2$ $(\hat{U}_1 \hat{V}_m^T ADJ_{22} B_{n+1}) M_3 \rightarrow M_3$ $(\hat{U}_1 \hat{V}_m^T ADJ_{22} B_{n+1}) M_4 \rightarrow M_4$ $M_5 - M_3^T (ADJ_{12} B_{n+1}) M_3 \rightarrow M_5$ $M_6 - M_3^T (ADJ_{12} B_{n+1}) M_4 \rightarrow M_6$ $M_7 - M_4^T (ADJ_{12} B_{n+1}) M_3 \rightarrow M_7$ $M_8 - M_4^T (ADJ_{12} B_{n+1}) M_4 \rightarrow M_8 \qquad (35)$ Those associated with the Lower sub-problems ($S_3$ and $S_4$) are updated in the following manner:

$(\tilde{U}_1 \tilde{V}_n^T ADJ_{11} B_{n+1}^T) M_1 \rightarrow M_1$ $(\tilde{U}_1 \tilde{V}_n^T ADJ_{11} B_{n+1}^T) M_2 \rightarrow M_2$ $M_3 + (\hat{V}_m \hat{U}_1^T ADJ_{21} B_{n+1}^T) M_1 \rightarrow M_3$ $M_4 + (\hat{V}_m \hat{U}_1^T ADJ_{21} B_{n+1}^T) M_2 \rightarrow M_4$ $$M_5 - M_1^T(ADJ_{21}B_{n+1}^T)M_1 \to M_5$$

$$M_6 - M_1^T(ADJ_{21}B_{n+1}^T)M_2 \to M_6$$

$$M_7 - M_2^T(ADJ_{21}B_{n+1}^T)M_1 \to M_7$$

$$M_8 - M_2^T(ADJ_{21}B_{n+1}^T)M_2 \to M_8 \quad (36)$$

The above procedure for modifying the matrix maps is repeated for each entry in the job list. In the final stage the matrix maps are used to generate the diagonal blocks of $A^{-1}$. It is important to note that this scheme fits nicely into a parallel framework due to the fact that systems handling Upper or Lower sub-problems would only have to trade the limited amount of information in (34) to modify the matrix maps they are governing.

| Pseudo-Code |
|---|
| 1. For each sub-problem in $\{1,2,...,D\}$ :<br>• Determine corner blocks from inverse of sub-problem<br>• Associate bridge matrix (excluding problem D)<br>• Initialize matrix maps<br>2. Generate list of sub-problem combinations radix 2<br>3. Adjust mappings for each combining step<br>4. Compute diagonal elements for each division<br>5. Apply matrix maps to transform sub-problem solutions to the global solution |

The time complexity of the divide and conquer algorithm is $O(N_x^\alpha N_y + N_x^3 D \log_2 D)$ where $\alpha$ is defined to be the order associated with a $N_x \times N_x$ matrix multiplication (typically $\alpha \approx 2.7$). The memory consumption is $$O\left(\frac{N_x^2 N_y}{D} + N_x^2 D\right).$$

The divide and conquer algorithm, along with the algorithm in Svizhenko et al. have been implemented, in Matlab, on a single 32-bit x86 Linux workstation. All results reported are for test cases on a MIT well-tempered 25 nm device-like structure.

Table 7 shows the run-time comparison of the two algorithms across the cases: $N_x=100$, $N_y=3,000-80,000$. Notice that the algorithm given in Svizhenko et al. was unable to perform past the case $N_y=11,000$ due to memory restrictions. However, the divide and conquer algorithm was able to handle these cases without encountering memory overflow.

Figure 15:
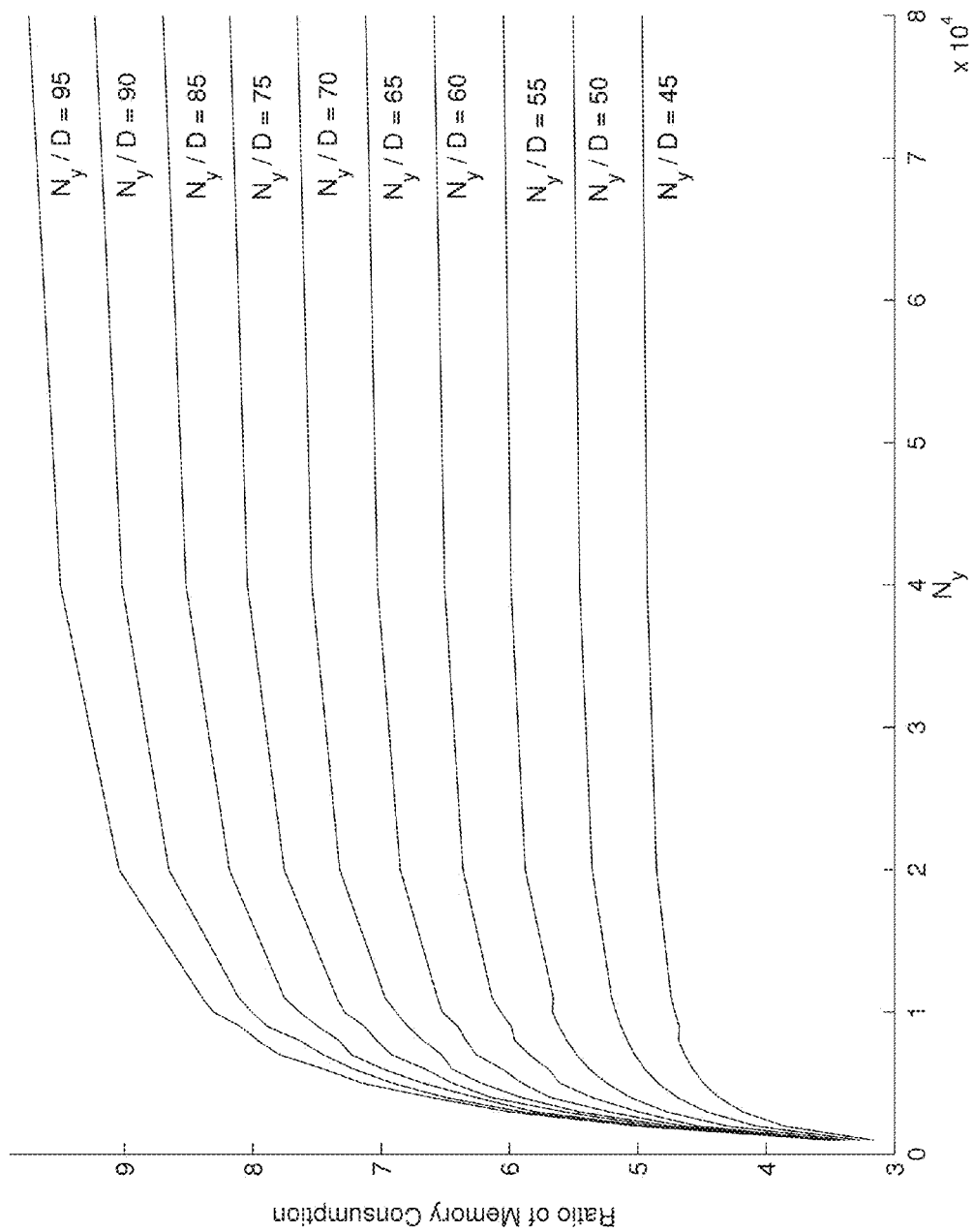
FIG. 15 shows the ratio of memory consumption of the algorithm in [9] as compared to ours for varying division sizes ($N_y/D$).
Figure 16:
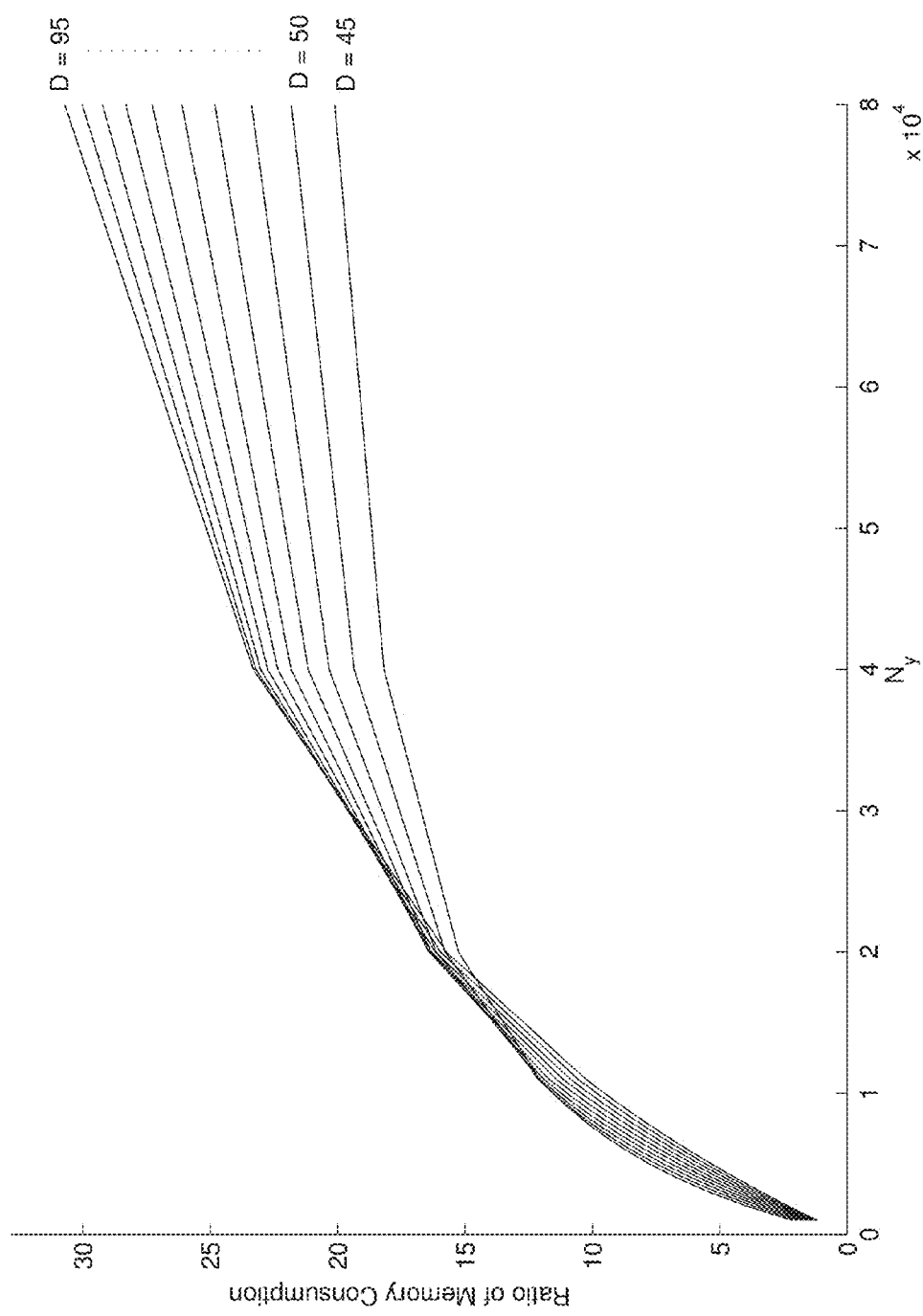
FIG. 16 shows the ratio of memory consumption of the algorithm in [9] as compared to ours for a varying number of divisions (D).

FIG. 15 shows the ratio of memory consumption of the algorithm in Svizhenko et al. as compared to the divide and conquer algorithm for varying number of blocks per division (sub-problem size). FIG. 16 shows the same ratio for varying number of divisions.

While the invention has been illustrated and described in detail in the drawings and foregoing description, the same is to be considered as illustrative and not restrictive in character, it being understood that only the preferred embodiment has been shown and described and that all changes and modifications that come within the spirit of the invention are desired to be protected.

What is claimed is:

1. A system for simulating operation of a VLSI interconnect structure having capacitive and inductive coupling between nodes thereof, comprising:

a processor; and a memory, said processor configured to:

obtaining a matrix X and a matrix Y containing different combinations of passive circuit element values for said interconnect structure, said element values for each matrix including inductance L and inverse capacitance P, obtaining an adjacency matrix A associated with said interconnect structure, storing said matrices X, Y, and A in said memory, and performing numerical integration to solve first and second equations each including as a factor product of inverse said matrix X ($X^{-1}$) and at least one other matrix, said first equation including $X^{-1}Y$, $X^{-1}A$, and $X^{-1}P$, and said second equation including $X^{-1}A$ and $X^{-1}P$.

2. The system of claim 1, wherein said matrices X and Y each contain resistance values in addition to L and P.

3. The system of claim 2, wherein said first equation is substantially of the form, $$i_l^{k+1} = X^{-1}Y i_l^k + X^{-1}A v_n^k + \frac{h}{4}X^{-1}AP(I_s^{k+1} + I_s^k),$$

where $v_n$ and $i_l$ are node voltages and inductor currents, respectively, A is an adjacency matrix for the circuit, and

TABLE 7

Run time (min) comparison

| | Size = $N_x * N_y$ (×10$^6$) | | | | | | | | | | |
|---|---|---|---|---|---|---|---|---|---|---|---|
| | 0.4 | 0.5 | 0.6 | 0.7 | 0.8 | 0.9 | 1.0 | 1.1 | 2.0 | 4.0 | 8.0 |
| Divide and Conquer Algorithm | 5.38 | 6.66 | 8.10 | 9.41 | 11.13 | 12.25 | 13.75 | 14.99 | 27.59 | 58.86 | 107.0 |
| Algorithm in Svizhenko et al. | 1.22 | 1.51 | 1.82 | 2.12 | 2.43 | 2.72 | 3.01 | 3.33 | — | — | — |

$I_s$ is a current source vector, and wherein said second equation is substantially of the form $$X^{-1}Av_n^{k+1} = X^{-1}Av_n^k - \frac{h}{2}X^{-1}APA^T(i_l^{k+1} + i_l^k) + \frac{h}{2}X^{-1}AP(I_s^{k+1} + I_s^k).$$ (5)

* * * * *